US010665451B2

(12) United States Patent
Ooi et al.

(10) Patent No.: US 10,665,451 B2
(45) Date of Patent: May 26, 2020

(54) NANOWIRES-BASED LIGHT EMITTERS ON THERMALLY AND ELECTRICALLY CONDUCTIVE SUBSTRATES AND OF MAKING SAME

(71) Applicant: KING ABDULLAH UNIVERSITY OF SCIENCE AND TECHNOLOGY, Thuwal (SA)

(72) Inventors: Boon Siew Ooi, Thuwal (SA); Chao Zhao, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 31 days.

(21) Appl. No.: 15/753,578

(22) PCT Filed: Oct. 7, 2016

(86) PCT No.: PCT/IB2016/056031
§ 371 (c)(1),
(2) Date: Feb. 20, 2018

(87) PCT Pub. No.: WO2017/068450
PCT Pub. Date: Apr. 27, 2017

(65) Prior Publication Data
US 2018/0261455 A1 Sep. 13, 2018

Related U.S. Application Data

(60) Provisional application No. 62/243,793, filed on Oct. 20, 2015.

(51) Int. Cl.
*H01L 21/02* (2006.01)
*H01L 29/06* (2006.01)
(Continued)

(52) U.S. Cl.
CPC .. *H01L 21/02603* (2013.01); *H01L 21/02631* (2013.01); *H01L 29/0669* (2013.01);
(Continued)

(58) Field of Classification Search
CPC . H01L 33/08; H01L 27/153; H01L 21/02636; H01L 21/0254; H01L 21/02603;
(Continued)

(56) References Cited

U.S. PATENT DOCUMENTS 7,629,195 B2  12/2009  Tran et al.
8,004,001 B2  8/2011  Yuan et al.
(Continued)

FOREIGN PATENT DOCUMENTS

EP    2863426 A1    4/2015
KR    20110035395 A  4/2011
(Continued)

OTHER PUBLICATIONS

Kikuchi et al., InGaN/GaN Multiple Quantum Disk Nanocolumn Light-Emitting Diodes Grown on (111) Si Substrate, Nov. 5, 2004, Japanese Journal of Applied Physics, vol. 43, No. 12A, 2004, pp. L1524-L1526 (Year: 2004).*
(Continued)

*Primary Examiner* — Changhyun Yi
(74) *Attorney, Agent, or Firm* — Patent Portfolio Builders PLLC

(57) ABSTRACT

Elemental or compound semiconductors on metal substrates and methods of growing them are provided. The methods can include the steps of: (i) providing a metal substrate; (ii) adding an interlayer on a surface of the metal substrate, and (iii) growing semiconductor nanowires on the interlayer using a semiconductor epitaxy growth system to form the elemental or compound semiconductor. The method can include direct growth of high quality group III-V and group (Continued)

III-N based materials in the form of nanowires and nanowires-based devices on metal substrates. The nanowires on all-metal scheme greatly simplifies the fabrication process of nanowires based high power light emitters.

20 Claims, 17 Drawing Sheets

(51) Int. Cl.
  *H01L 31/0352* (2006.01)
  *H01L 33/22* (2010.01)
  *H01L 33/32* (2010.01)
  *H01L 33/40* (2010.01)

(52) U.S. Cl.
  CPC ...... *H01L 31/035227* (2013.01); *H01L 33/32* (2013.01); *H01L 33/405* (2013.01)

(58) Field of Classification Search
  CPC ........... H01L 29/0665; H01L 29/66469; H01L 29/66439; H01L 29/0676
  See application file for complete search history.

(56) References Cited

U.S. PATENT DOCUMENTS

| | | | |
|---|---|---|---|
| 2008/0293171 | A1 | 11/2008 | Tran et al. |
| 2010/0328898 | A1* | 12/2010 | Kabir ............... B01J 23/755 361/713 |
| 2011/0214709 | A1* | 9/2011 | Evelsizer ............ H01L 31/072 136/244 |
| 2014/0069499 | A1 | 3/2014 | Kiriya et al. |
| 2014/0117307 | A1* | 5/2014 | Herner ............... H01L 33/0095 257/13 |
| 2014/0117308 | A1 | 5/2014 | Hyot et al. |
| 2014/0264261 | A1 | 9/2014 | Mastro et al. |
| 2015/0214050 | A1* | 7/2015 | Bertness .......... H01L 21/02603 435/309.1 |
| 2016/0284938 | A1* | 9/2016 | Hyot ..................... H01L 33/18 |
| 2016/0322536 | A1* | 11/2016 | Dornel ................ H01L 33/0075 |

FOREIGN PATENT DOCUMENTS

| | | |
|---|---|---|
| KR | 20130028307 A | 3/2013 |
| WO | 2007/037762 A1 | 4/2007 |

OTHER PUBLICATIONS

Aratin, S., et al.; "Review of recent progress of III-nitride nanowire lasers"; J. Nanophotonics, vol. 7,2013; pp. 074599-1 through 074599-27.
Arik, M., et al.; "Thermal Management of LEDs: Package to System"; J. in Proc. SPIE 5187, Third International conference on Solid State Lighting; 2014; pp. 64-75.
Bakti Utama, M. I., et al.; "Recent developments and future directions in the growth of nanostructures by van der Waals epitaxy"; Nanoscale 5; 2013; pp. 3570-3588.
Carnevale, S. D., et al.; "Mixed Polarity in Polarization-Induced p-n Junction Nanowire Light-Emitting Diodes"; Nano Lett. 13, Jun. 11, 2013; pp. 3029-3035.
Carnevale, S. D., et al.; "Three-Dimensional GaN/AlN Nanowire Heterostructures by Separating Nucleation and Growth Processes"; Nano Letters 11; Jan. 25, 2011; pp. 866-871.
Carter, J. C. H. et al.; "Progress in SiC: from material growth to commercial device development"; Materials Science & Engineering B61-62, 1-8; 1999; pp. 1-8.
Chen, C., et al.; "Electron scattering via interactions with optical phonons in wurtzite crystals"; Phys. Rev. B 70; Aug. 2004; pp. 075316.1-075316.7.
Chen, N.C., et al.; "Nitride light-emitting diodes grown on Si (111) using a TiN template"; Appl. Phys. Lett. 88, May 10, 2006; pp. 191110.1-191110.3.
Cheng, J. P., et al.; "High mobility AlGaN/GaN heterostructures grown on Si substrates using a large lattice-mismatch induced stress control technology"; Applied Physics Letters 106, 142106; 2015; pp. 142106-1 through 142106-4.
Choi, J.H., et al.; "Nearly single-crystalline GaN light-emitting diodes on amorphous glass substrates"; Nature Photonics, vol. 5; Dec. 2011; pp. 763-769.
Colby, R., et al.; "Dislocation Filtering in GaN Nanostructures"; Nano Letters 10; Apr. 16, 2010; pp. 1568-1573.
De la Mata, M., et al.; "Polarity Assignment in ZnTe, GaAs, ZnO, and GaN—AlN Nanowires from Direct Dumbbell Analysis"; Nano Lett. 12, Apr. 11, 2012; pp. 2579-2586.
Dhara, S., et al.; "Recrystallization of epitaxial GaN under indentation"; Appl. Phys. Lett. 92, Apr. 11, 2008; pp. 143114.1-143114.3.
Edwards, P. R.; Martin, et al.; "InGaN/GaN Quantum Well Microcavities Formed by Laser Lift-Off and Plasma Etching"; Phys. Status Solidi (b); No. 1; Jun. 28, 2001; pp. 91-94.
Feezell, D. et al.; "Semipolar (2021) InGaN/GaN Light-Emitting Diodes for High-Efficiency Solid-State Lighting"; J. Display Technol. vol. 9, No. 4; Apr. 2013; pp. 190-198.
Fernandez-Garrido, S., et al.; "Correlation between the structural and optical properties of spontaneously formed GaN nanowires: a quantitative evaluation of the impact of nanowire coalescence"; Nanotechnology 25, 455702; Oct. 20, 2014; pp. 1-8.
Fernández-Garrido, S., et al.; "Self-Regulated Radius of Spontaneously Formed GaN Nanowires in Molecular Beam Epitaxy"; Nano Lett. 13, Jun. 11, 2013; pp. 3274-3280.
Frost, T., et al.; "Monolithic Electrically Injected Nanowire Array Edge-Emitting Laser on (001) Silicon"; Nano Letters 14, American Chemical Society, Jun. 27, 2014; pp. 4535-4541.
Gautier, S., et al.; "Optical and electrical properties of TiN/n-GaN contacts in correlation with their structural properties"; Semiconductor Science and Technology, No. 18; May 2003; pp. 594-601.
Geelhaar, L., et al.; "Properties of GaN Nanowires Grown by Molecular Beam Epitaxy"; IEEE J. Sel. Top. Quant. vol. 17, No. 4, Jul./Aug. 2011; pp. 878-888.
Guo, W., et al.; "Catalyst-Free InGaN/GaN Nanowire Light Emitting Diodes Grown on (001) Silicon by Molecular Beam Epitaxy"; Nano Letters, No. 10, American Chemical Society; Aug. 11, 2010; pp. 3355-3359.
Hestroffer, K., et al.; "In situ study of self-assembled GaN nanowires nucleation on Si(111) by plasma-assisted molecular beam epitaxy"; Appl. Phys. Lett. 100; 2012; pp. 212107-1 through 21207-5.
Höche, D.,et al.; "Microstructure of TiN coatings synthesized by direct pulsed Nd:YAG laser nitriding of titanium: Development of grain size, microstrain, and grain orientation"; Appl. Phys. A 91, Feb. 16, 2008; pp. 305-314.
Jahangir, S., et al.; "Small signal modulation characteristics of red-emitting ($\lambda$=610 nm) III-nitride nanowire array lasers on (001) silicon"; Appl. Phys. Lett. 106, 071108 (2015); pp. 071108-1 through 071108-4.
Jang, H. W., et al.; "Characterization of band bendings on Ga-face and N-face GaN films grown by metalorganic ahemical-vapor deposition"; Appl. Phys. Leff. vol. 80, No. 21; May 27, 2002; pp. 3955-3957.
Jen-Hau, C., et al.; "Thermal Management of Vertical Gallium Nitride Nanowire Arrays: Cooling Design and Tip Temperature Measurement"; Micro Electro Mechanical Systems (MEMS); 2010 IEEE 23rd International Conference; pp. 468-471.
Kibria, M.G., et al.; "Tuning the surface Fermi level on p-type gallium nitride nanowires for efficient overall water splitting"; Nature Communications, No. 5:3835; Apr. 30, 2014; pp. 1-6.
Kumar, P., et al.; "Superstructure of self-aligned hexagonal GaN nanorods formed on nitrided Si(111) surface"; Appl. Phys. Lett. 101, 2012; pp. 131605.1-131605.5.
Kuo, S. Y., et al.; "Catalyst-free GaN nanorods grown by metalorganic molecular beam epitaxy"; 5th IEEE Conference on Nanotechnology; Jul. 2005; pp. 273-277.

(56) References Cited

OTHER PUBLICATIONS

Kwak, J. S., et al.; "Crystal-polarity dependence of Ti/Al contacts to freestanding n-GaN substrate"; Appl. Phys. Lett. vol. 79, No. 20; Nov. 12, 2001; pp. 3254-3256.

Lee, H. Y., et al.; "Light Output Enhancement of GaN-Based Roughened LEDs Using Bias-Assisted Photoelectrochemical Etching Method"; J. Electrochem. Soc., 155 (10); Aug. 1, 2008; pp. H707-H709.

Lee, S. H., et al.; "Thermal and Optical Properties of InGaN/GaN Green Vertical Light-Emitting Diodes on Molybdenum Substrate for Different Submounts"; Japanese Journal of Applied Physics 52; 2013; pp. 102102.1-102102.4.

Li, C., et al.; "Current Imaging and Electromigration-Induced Splitting of GaN Nanowires As Revealed by Conductive Atomic Force Microscopy"; ACS Nano vol. 4, No. 4; Mar. 17, 2010; pp. 2422-2428.

Lin, Y. R. et al.; "Buffer-Facilitated Epitaxial Growth of ZnO Nanowire"; Crystal Growth & Design, vol. 5, No. 2; Oct. 26, 2004; pp. 579-583.

Martin, R. M.; "Theory of the One-Phonon Resonance Raman Effect"; Phys. Rev. B, vol. 4, No. 10; Mar. 19, 1971; pp. 3676-3685.

Matthews, J., et al.; "Heat flow in InAs/InP heterostructure nanowires"; Phys. Rev. B 86, 2012; pp. 174302.1-174302.8.

Mi, Z., et al.; "Molecular beam epitaxial growth and characterization of InGaN/GaN dotin-a-wire nanoscale heterostructures: toward ultrahigh efficiency phosphorfreewhite light emitting diodes"; Proceedings of SPIE 8634, Quantum Dots and Nanostructures: Synthesis, Characterization and Modeling X; Mar. 29, 2013; pp. 86340B1-86340B8.

Nguyen., H. P. T., et al.; "Engineering the Carrier Dynamics of InGaN Nanowire White Light-Emitting Diodes by Distributed p-AlGaN Electron Blocking Layers"; Sci. Rep. 5:7744; Jan. 16, 2015; pp. 1-7.

Perry, A. J., et al.; "The Reflectance and Color of Titanium Nitride"; J. Vac. Sci. Technol. A 4(6); Nov./Dec. 1986; pp. 2674-2677.

Phillips, P. J., et al.; "Full-Scale Characterization of UVLED AlxGa1—xN Nanowires via Advanced Electron Microscopy"; ACS Nano vol. 7, No. 6; May 15, 2013; pp. 5045-5051.

Prusi A. et al.; "Anodic behavior of Ti in KOH solutions—Ellipsometric and micro-Raman spectroscopy studies"; J. Electrochem. Soc. 149 (11); Sep. 18, 2002; pp. B491-B498.

Ra, Y.-H., et al.; "Different characteristics of InGaN/GaN multiple quantum well heterostructures grown on m- and r-planes of a single n-GaN nanowire using metalorganic chemical vapor deposition"; J. Mater. Chem. C 2; Jan. 30, 2014; pp. 2692-2701.

Sarwar, A. T. M. G., et al.; "Semiconductor Nanowire Light-Emitting Diodes Grown on Metal: A Direction Toward Large-Scale Fabrication of Nanowire Devices"; Small Journal; 11, No. 40; 2015; pp. 5402-5408.

Schuster, F., et al.; "Position-Controlled Growth of GaN Nanowires and Nanotubes on Diamond by Molecular Beam Epitaxy"; Nano Lett. No. 15; 2015; pp. 1773-1779.

Shiojiri, M., et al.; "Structure and growth of ZnO smoke particles prepared by gas evaporation technique."; J. Cryst. Growth 52, Part 1,; 1981; pp. 173-177.

Siegle, H. et al.; "Quantitative determination of hexagonal minority phase in cubic GaN using Raman spectroscopy"; Solid State Commun., vol. 96, No. 12; Aug. 10, 1995; pp. 943-949.

Tabata, A., et al.; "Comparative Raman studies of cubic and hexagonal GaN epitaxial layers"; J. Appl. Phys. 79 (8); Apr. 1996; pp. 4137-4140.

Tan, B. S., et al.; "Performance enhancement of InGaN light-emitting diodes by laser lift-off and transfer from sapphire to copper substrate"; Appl. Phys. Lett. vol. 84, No. 15; Apr. 12, 2004; p. 2757-2759.

Tchernycheva, M., et al.; "Growth of GaN free-standing nanowires by plasma-assisted molecular beam epitaxy: structural and optical characterization"; Nanotechnology 18; Aug. 31, 2007; pp. 385306 1-7.

Tsai, M. T. et al ; "The effect of free-standing GaN substrate on carrier localization in ultraviolet InGaN light-emitting diodes"; Nanoscale. Res. Lett. 9, 675; 2014; pp. 1-7.

International Search Report in related International Application No. PCT/IB2016/056031, dated Jan. 19, 2017.

Ng, T.K., et al., "Red to Near-Infrared Emission from InGaN/GaN Quantum-Disks-in-Nanowires LED," 2014 Conference on Lasers and Electro-Optics (CLEO)—Laser Science to Photonic Applicat, The Optical Society, Jun. 8, 2014, pp. 1-2.

Written Opinion of the International Searching Authority in related International Application No. PCT/IB2016/056031, dated Jan. 19, 2017.

Communication pursuant to Article 94(3) EPC in corresponding/related European Application No. 16794050.1, dated Jan. 23, 2020 (Reference D9 was previously provided in the IDS filed Apr. 20, 2018).

Sarwar, Atm G. et al., "Polarization Engineered Deep Ultraviolet Nanowire LEDs Integrated on Silicon and Metal Substrates," 2015 IEEE Summer Topicals Meeting Series (SUM), IEEE, Jul. 13, 2015, pp. 125-126.

\* cited by examiner 50 nm

1 μm

0

500 nm 50 nm

1 μm

0

500 nm

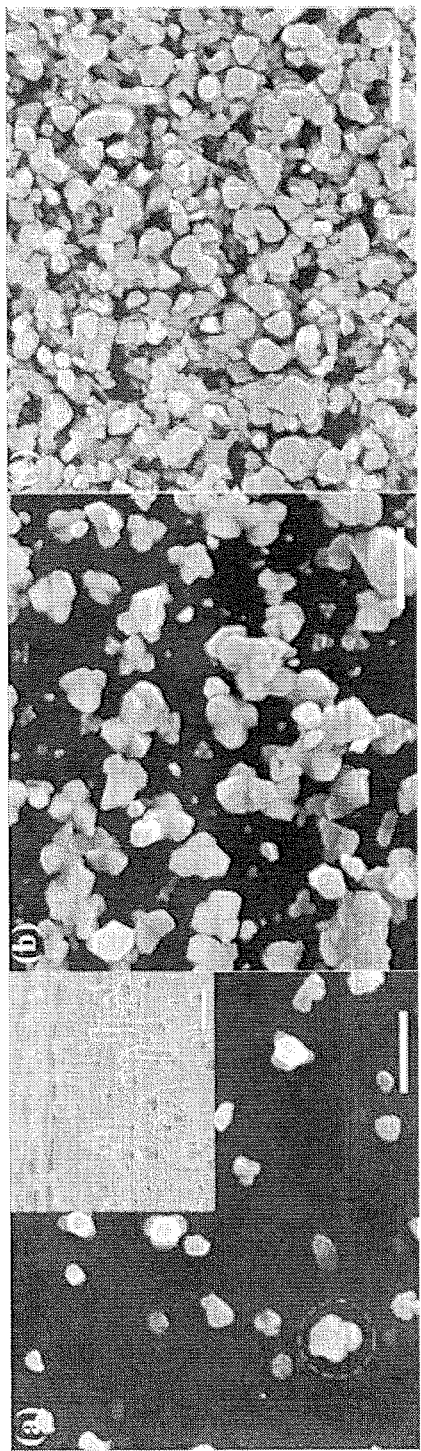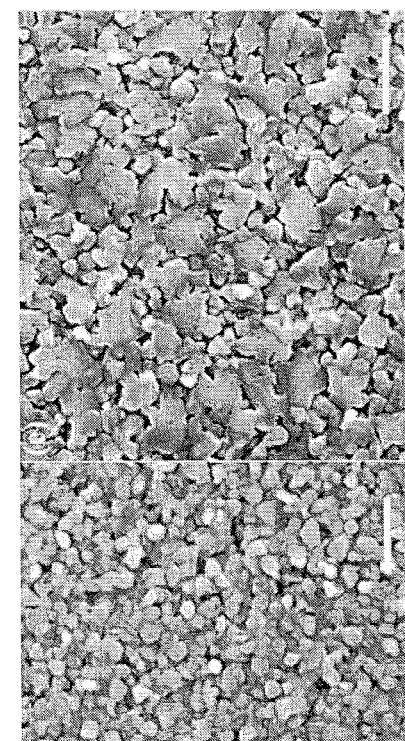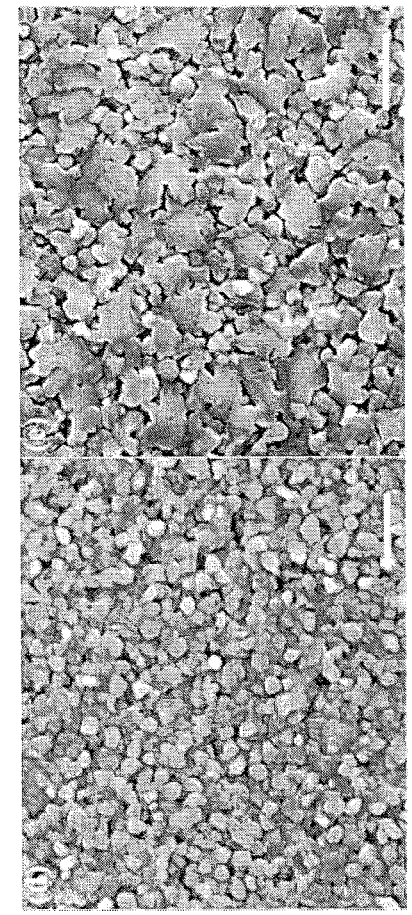
FIG. 6A 720 °C
FIG. 6B 680 °C
FIG. 6C 640 °C
FIG. 6D 600 °C
FIG. 6E 560 °C

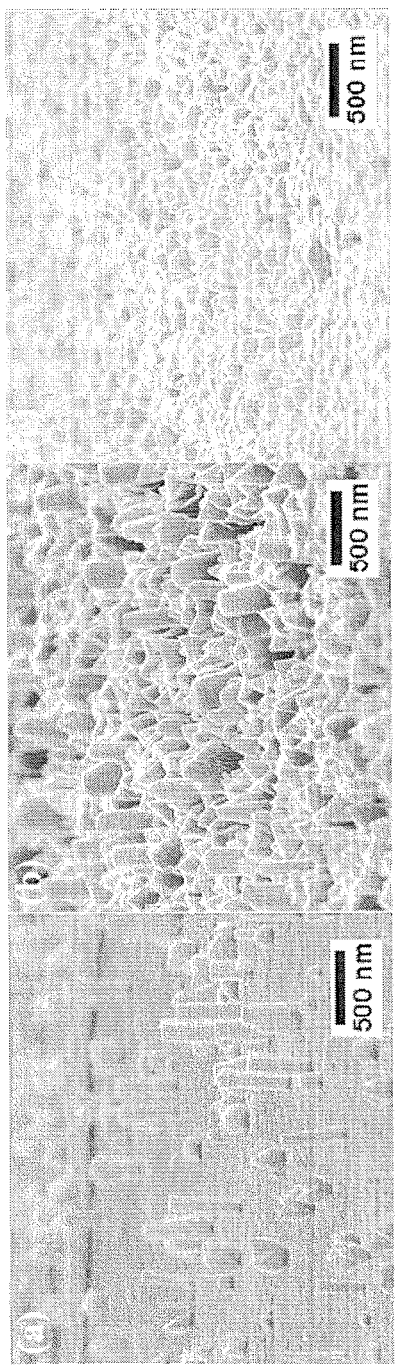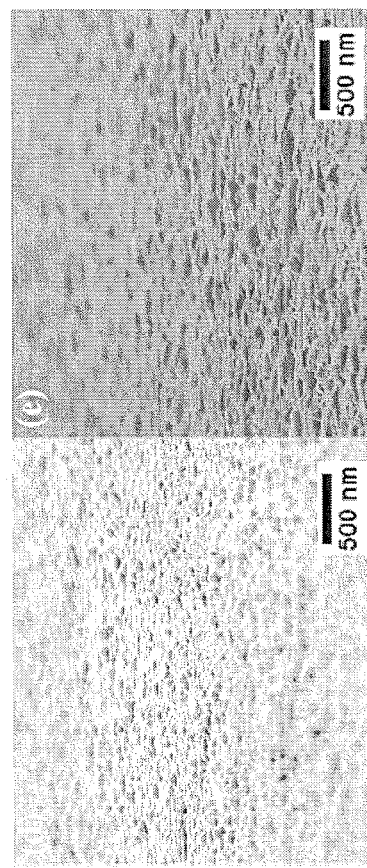
FIG. 7A 720 °C
FIG. 7B 680 °C
FIG. 7C 640 °C
FIG. 7D 600 °C
FIG. 7E 560 °C $1\times10^{-8}$ Torr $2.5\times10^{-8}$ Torr $5\times10^{-8}$ Torr $1\times10^{-7}$ Torr

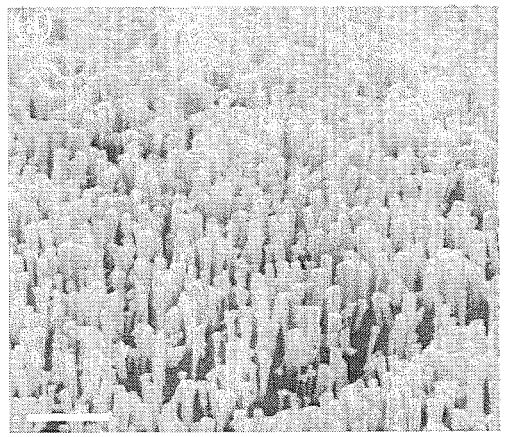
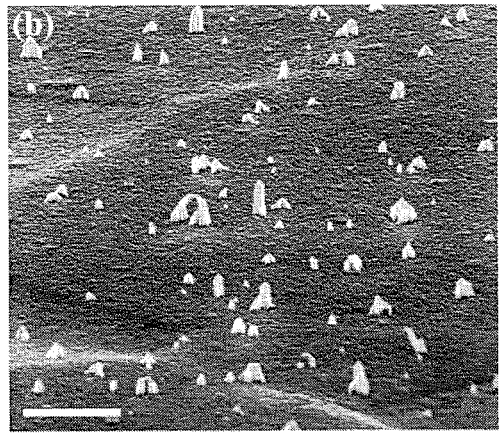
FIG. 9A
FIG. 9B
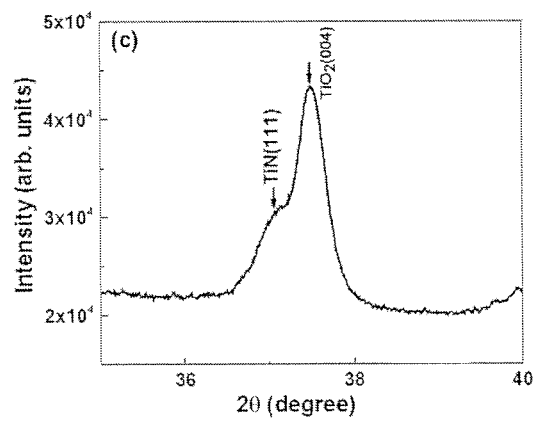
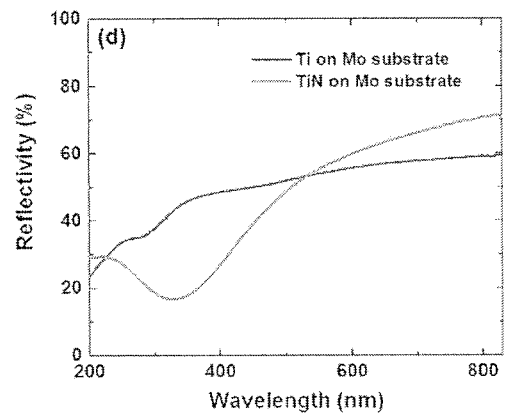
FIG. 9C
FIG. 9D

NANOWIRES-BASED LIGHT EMITTERS ON THERMALLY AND ELECTRICALLY CONDUCTIVE SUBSTRATES AND OF MAKING SAME

CROSS-REFERENCE TO RELATED DOCUMENTS

This application is a U.S. National Stage Application of International Application No. PCT/IB2016/056031, filed on Oct. 7, 2016, which claims the benefit of and priority to U.S. Provisional Application Ser. No. 62/243,793, having the title "NANOWIRES-BASED LIGHT EMITTERS ON THERMALLY AND ELECTRICALLY CONDUCTIVE SUBSTRATES AND OF MAKING SAME," filed on Oct. 20, 2015, the disclosures of which are incorporated herein by reference in their entirety.

This application makes reference to and incorporates by reference the following paper as if it were fully set forth herein expressly in its entirety: Facile Formation of High-quality InGaN/GaN Quantum-disks-in-Nanowires on Bulk-Metal Substrates for High-power Light-emitters, *Nano. Lett.* 2016, 16, 1056-1063, attached hereto as Appendix A.

TECHNICAL FIELD

The present disclosure generally relates to nanowires, nanowires devices and methods of making same.

BACKGROUND

Group III-nitride vertically aligned nanowires and nanowire-devices on silicon have recently been developed for solid-state lighting. They have shown various advantages over their counterparts, such as GaN on sapphire,[1] GaN bulk substrates,[2] SiC,[3] and GaN-on-silicon substrates.[4] High efficiency phosphor-free white nanowire light-emitting diodes (NW-LEDs) on silicon exhibited nearly zero efficiency droop.[5] These InGaN/GaN nanowires and white-emitting LEDs showed negligible quantum confined Stark effect (QCSE), which is desirable for improved quantum efficiencies.[6]

Despite the high-quality nanowires and superior devices grown on single-crystalline silicon substrates, there are issues that remain to be addressed. One of the issues is related to the formation of an amorphous SiNx layer when the active nitrogen radicals impinge upon the silicon surface,[11] which hinders carriers flow and heat dissipation. The small diameter of the nanowires can cause high junction temperature of NW-LEDs and lasers associated with the high injection current density, as compared to that in conventional planar devices.[12] Additionally, the electrons and phonons that carry the heat are confined to one-dimensional transport along the nanowire.[13,14] The thermal management of nanowire devices thus can be important to avoiding "thermal droop" because of the high heat flux and carrier de-population from the Qdisks, leading to efficiency roll-over.[15] The issue is further aggravated by the fact that, in practical solid-state lighting applications, the operating temperature can be as high as 120° C.,[16] Furthermore, significant visible light absorption reduces quantum efficiencies in LEDs on silicon.

Although GaN nano and microstructures have been demonstrated on diamond and amorphous glass,[17,18] which address the thermal conductivity and/or absorption issues, respectively. This technique does not simultaneously resolve the absorption, thermal- and electrical-conductivity issues for high-power device operation at elevated temperatures.

Accordingly, there is a need to address the aforementioned issues.

SUMMARY

In an embodiment, a method of growing elemental or compound semiconductors on metal substrates is provided. In one or more aspects, high quality nitride materials grown on low cost and scalable metallic substrates are provided. They can be, highly attractive, for example, for high power and high brightness optical devices due to their excellent thermal, and electrical conductivity for addressing thermal and efficiency droop in light-emitters.

In an embodiment, methods of direct growth of high quality group III-V (such as GaAs, InP, GaSb and their related ternary and quaternary compounds, such as ALGaAs, InGaP, InGaAs, InGaAsP, etc.) and group III-N (such as GaN, AlN, InN, InGaN, AlGaN, and their related binary, ternary and quaternary compounds) based materials in the form of nanowires and nanowires-based devices on metal substrates are presented. The nanowires on all-metal scheme greatly simplifies the fabrication process of nanowires based high power light emitters especially high power LEDs and laser diodes (LDs), and high power electronic devices (such as high mobility transistors (HEMTs), etc.), overcoming limited thermal and electrical conductivity of nanowires grown on silicon substrates and metal thin film in prior art.

Semiconductor nanowires on all-metal structure as described herein can support a variety of devices including but not limited to very high power solid-state light sources such as LEDs and LDs, high resolution flat panel display devices, flexible devices, photovoltaics, devices for water splitting and visible light communication, as well as power electronic devices HEMT, HBT, and FET devices for ac-dc conversion and inversion. In addition, semiconductor nanowires on high conductivity metallic substrate can also increase the device lifetime of photonics and electronics devices. In various aspects, improved performance NW-LEDs and lasers demonstrating emitting at green, red and longer wavelength using InGaN/GaN Qdisks in nanowires on silicon are provided herein.[7-10]

In an embodiment a method of growing an elemental or compound semiconductor on a metal substrate is provided. The method can comprise the steps of: (i) providing a metal substrate; (ii) adding an interlayer on a surface of the metal substrate, and (iii) growing semiconductor nanowires on the interlayer using a semiconductor epitaxy growth system to form the elemental or compound semiconductor. In any one or more aspects the metal substrate can be a thermally and electrically conductive metal, preferably Mo, Ta, or W. The interlayer can be comprised of a metal, such as Ti, TiN, TaN, HfN, TiAlN. The semiconductor epitaxy growth system can be a molecular beam epitaxy (MBE) or a metal-organic vapor pressure epitaxy (MOVPE) system. The compound semiconductor can include a III-V compound semiconductor, such as GaAs, InP, GaSb, and their related ternary and quaternary compounds, such as AlGaAs, InGaP, InGaAs, InGaAsP, etc. The compound semiconductor can be a III-N compound semiconductor, such as GaN, AlN, InN, InGaN, AlGaN, and their related binary, ternary, and quaternary compound semiconductors. The metal substrate can be a bulk metal substrate or a metal foil. The interlayer can be deposited on the surface of the metal substrate using a thin film deposition technique, preferably chemical vapor deposition (CVD), atomic layer deposition (ALD), a sputtering coating technique, pulsed laser deposition (PLD), thermal evaporation, or an e-beam evaporation technique, etc. The elemental or compound semiconductor can be an all-metal structure. The elemental semiconductor can include a silicon or germanium, and/or Si—Ge compound.

In an embodiment, a semiconductor device structure is provided. The semiconductor device structure can be formed from any one or more aspects of the aforementioned method. In any one or more aspects the semiconductor device structure can comprise multiple semiconductor layers to form p-i-n, n-i-p, quantum well/barrier, heterostructure or double heterostructures for light emitting devices. The semiconductor device structure can be in the form of an optoelectronic or a photonic device including but not limited to typical light emitting diodes (LEDs), laser diodes (LDs), photodiodes, optical modulators, semiconductor optical amplifiers, photovoltaic or solar cell structures, etc. The semiconductor device structure can be in the form of an electronics device including but not limited to HEMTs, HBTs, FETs, etc. The light emission and absorption characteristics of the semiconductor device structure can be achieved by adjusting the material composition of the nanowires.

Other systems, methods, features, and advantages of the present disclosure, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6A-6M depict plane-view SEM images of the GaN nanowires grown on Ti/Mo substrates at different temperatures (FIGS. 6A-6E) and using different gallium fluxes at 640° C. and Ti thickness of 500 nm (FIGS. 6F-6I); the scale bar is 500 nm. The branched structures are indicated by circles in FIG. 6A. FIG. 6J shows typical Raman spectra of GaN nanowires with Stokes line in a backscattering configuration using 325-nm and 473-nm lasers; the insets depict phonon modes in the wurtzite structure of GaN. Dependence of $E_2$(high)/$E_1$(TO) intensity ratio and the $E_2$(high) FWHM on (FIG. 6K) the growth temperature, (FIG. 6L) the Ga flux and (FIG. 6M) the thickness of the titanium interlayer.

FIGS. 7A-7I depict elevation-views of SEM images of GaN nanowires grown on Ti/Mo substrates at varying; temperatures (FIGS. 7A-7E), and (FIGS. 7F-7I) Ga fluxes (FIG. 7F-7I).

(FIG. 8A); (b) the XRD profiles of the nanowires samples (FIG. 8B); (c) plane-view (FIG. 8O) and (d) elevation-view (FIG. 8D) SEM images of the GaN nanowires; (e) room temperature PL spectra for the GaN nanowires (FIG. 8E); and (f) high-resolution TEM image taken along [2-1-10] zone axis of the GaN nanowire (FIG. 8F).

FIGS. 9A-9I depict SEM images of the GaN nanowires before (a) and after (b) KOH etching (FIGS. 9A and 9B, respectively); the scale bar is 500 nm. (c) The XRD profiles of the sample after KOH etching (FIG. 9C), (d) Reflectivity of Ti and TiN on molybdenum substrates (FIG. 9D). (e) Typical HAADF STEM of InGaN/GaN Qdisks nanowires (FIG. 9E); the InGaN Qdisks appear as brighter regions because of the higher atomic number of indium. (f) High-resolution HAADF STEM image of GaN nanowires (FIG. 9F), (g) High-resolution ABF STEM image of GaN nanowires (FIG. 9G); the scale bar is 1 nm. (h) Schematic of the N-polar c-plane GaN with the wurtzite crystalline structure viewed along the [2-1-10] direction (FIG. 9H). (i) Atomic-resolution ABF STEM image of GaN nanowires (FIG. 9I); the scale bar is 0.5 nm.

DETAILED DESCRIPTION

Figures 1A, 1B, 1C, 1D:
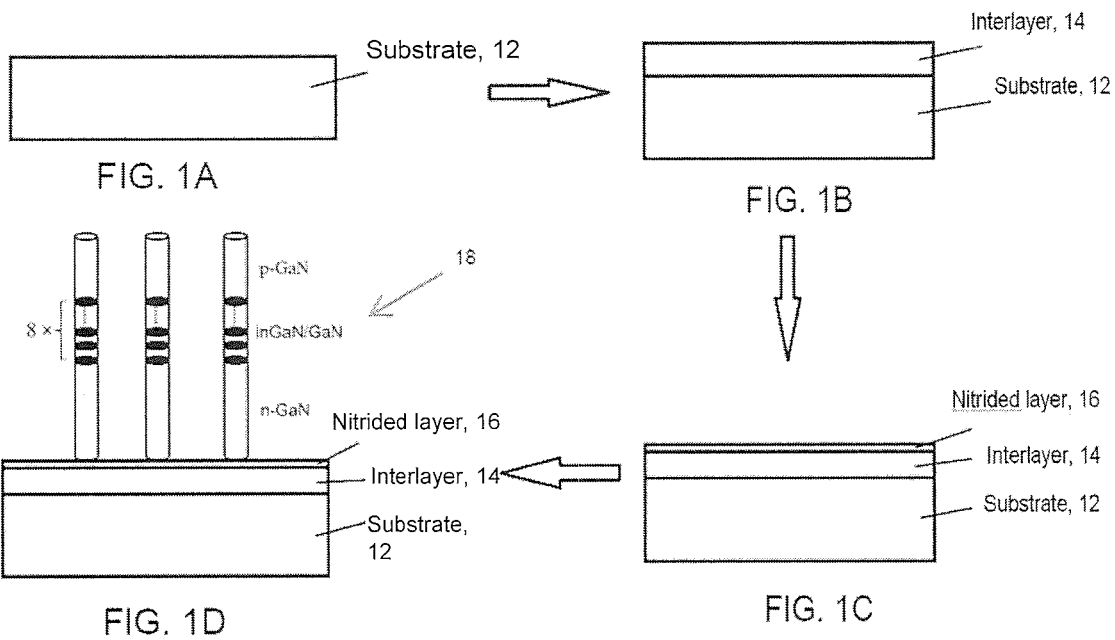
FIGS. 1A-1D depict a process for producing nanowires according to the present disclosure.

Described below are various embodiments of the present nanowires and nanowires devices and systems and methods for a making the same. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure ill be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C. and pressure is in bar. Standard temperature and pressure are defined as 0° C. and 1 bar.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

In an embodiment, a method of growing elemental or compound semiconductors on metal substrates is provided. The method can include adding an interlayer on a metal substrate and growing semiconductor nanowires thereon. A general process flow for growing nanowires or for making nanowires devices of the present disclosure is depicted in FIGS. 1A-1D. Beginning with FIG. 1A in the upper left portion and progressing clock-wise around the figures, a metal substrate 12 is provided. The metal substrate can be a bulk metal material. In any one or more aspects, the "bulk metal" can be a metal with thickness of at least 500 um. The substrate 12 can be any thermally and electrically conductive, for example, molybdenum, tantalum and/or tungsten. Next, as depicted in FIG. 1B, an interlayer 14 is added onto a surface of the substrate 12. For example, the interlayer 14 can be added by deposition by using a thin film deposition technique, such as electron beam being evaporation. Other methods for adding the interlayer 14 onto the surface of the substrate 12 can be used, such as chemical vapor deposition (CVD), atomic layer deposition (ALD) pulsed laser deposition (PLD), thermal evaporation and/or a sputtering coating technique. The interlayer can be comprised of a metal. Examples of metals that can be used for the interlayer 14 added onto the surface of the substrate 12 include titanium, tantalum, hafnium, titanium/aluminum, and combinations thereof. As depicted in FIG. 1C. The metal for the interlayer 14 can be a nitrided metal including, for example, TiN, TaN, HfN, TiAlN and combinations thereof. In various aspects, the interlayer 14 can have a thickness of up to about 1 µm. For example, the interlayer 14 can have a thickness of 50 nm up to 1 µm, 50 nm to 900 nm, 50 nm to 800 nm, 50 nm to 700 nm, 50 nm to 600 nm, 50 nm to 500 nm, 100 nm to 900 nm, 100 nm to 800 nm, 100 nm to 700 nm, 100 nm to 600 nm, 100 nm to 500 nm, 200 nm to 900 nm, 200 nm to 800 nm, 200 nm to 700 nm, 200 nm to 600 nm, or 200 nm to 500 nm.

Nanowires 18 can directly be grown on the interlayer 14 as depicted in FIG. 1D. The nanowires can be grown using a semiconductor epitaxy growth system. The epitaxy growth system can be a molecular beam epitaxy (MBE) system or a metal-organic vapor pressure epitaxy (MOVPE) system. For example, the metal substrate 12 including the interlayer 14 can be loaded in to an epitaxy chamber which can used for growing the nanowires 18. A Group III-N material can be provided to the chamber for growing the nanowires. Suitable examples of Group III-N materials include GaN, AlN, InN, InGaN, AlGaN, and their related binary, ternary and quarternary compounds. When the Group III-N material is used, the growth of the nanowires results in inherent nitridation of the interlayer 14. For example, where titanium is used to form the interlayer 14, growth of the nanowires results in inherent formation of TiN as a buffer layer 16 between the titanium interlayer and the nanowires and for growing wurtzite nanowire structures. A Group III-V material can also be introduced into the chamber for growing the nanowires and forming nanowires structures. Suitable examples of Group III-V materials include GaAs, InP, GaSb and their related ternary and quaternary compounds (such as AlGaAs, InGaP, InGaAs, InGaAsP, etc.).

Figure 2:
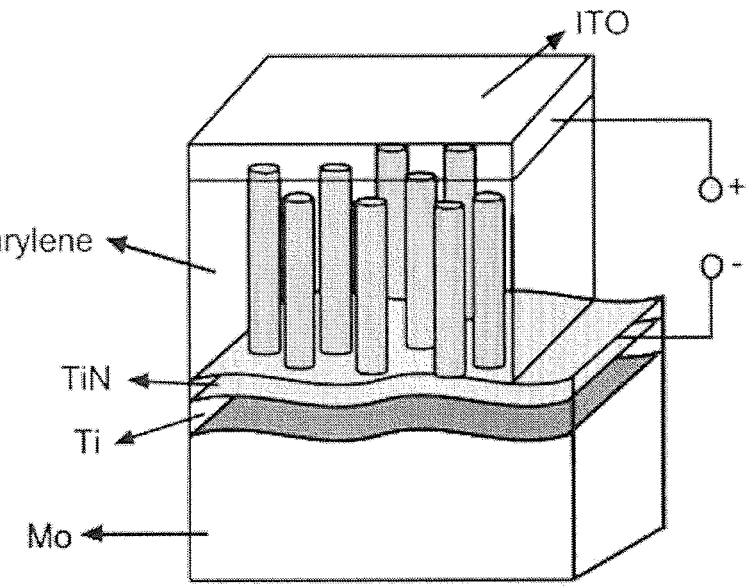
FIG. 2 depicts a typical prior art nanowire device produced from the process of FIGS. 1A-1D.

An example of nanowires and a nanowires structure formed by the process of FIGS. 1A-1D is depicted in FIG. 2, wherein molybdenum is used as the substrate 12, such as (for example, polycrystalline molybdenum) and titanium is added as the interlayer 14. Nanowires, for example, GaN nanowires 18 are grown on the titanium interlayer 14 resulting in inherent formation of an intermediary or buffer layer 16 of TiN between the nanowires 18 and the interlayer 14. If desired, the nanowires can be in cased in a material designed to serve as a moisture and/or dielectric barrier, such as parylene. Parylene is the trade name for a variety of chemical vapor deposited poly(p-xylylene) polymers used as moisture and dielectric barriers. Among them, Parylene C is popular due to its combination of barrier properties, cost, and other processing advantages. The parylene can be deposited, such as by chemical vapor deposition, onto the nanowires 18. A layer of indium tin oxide (ITO) can be added on top of the structure. ITO has advantages due to its electrical conductivity and optical transparency. ITO can serve as a contact base while the metal interlayer can serve as the base for an opposite contact. As can be seen, an all-metal nanowires device or structure can thus be formed by direct growth of a Group III-N or Group III-V material directly onto the metal substrate/interlayer (such as Mo/Ti) base.

Existing III-N based nanowires light emitters are primarily grown on silicon substrates. They suffer, however, from the formation of insulating silicon nitride layer at the interface of nanowires and silicon substrates due to the nitridation of silicon. Herein, a new method is provided to eliminate this issue as the nitrided metal interlayer forms a thermally and electrically conductive layer. The nitrided metal interlayer as described herein can also serve as an optical reflector for long visible wavelength light. Hence, the metal nitride layer can become an integral part of the present device structure for increasing the electrical efficiency and light extraction efficiency, as compared to nanowires grown directly on silicon substrates.

Nanowires have also been previously grown on sputtered Mo or Ti thin film on Si or sapphire substrates. These prior nanowires still suffer from poor thermal and electrical conductivity of the substrate. In contrast, in various aspects nanowires as described herein are grown directly on bulk metal substrates.[22,23]

Unlike the previous techniques for transferring planar multiple-quantum-well light-emitting epitaxy onto conductive substrates, which require complex fabrication processing steps such as transfer of LED epitaxy onto copper- or molybdenum-based substrates or transfer to flexible substrates based on laser lift-off (LLO) or photo-electrochemical etching (PEC) lift-off, the present method significantly avoids these complexities. Typical lifted off membrane in the method involves straight forward wet etching of a sacrificial layer, for example titanium.[53-55]

In an aspect, the present method allows facile transfer of light-emitting epitaxy including the grown-in nitride metal layer onto foreign substrates. The method can use a sacrificial metal layer included in the layer structure, without resorting to LLO and PEC. Hence the method is versatile for direct formation of either discrete component or transfer of light-emitting membrane onto foreign substrates, either rigid or flexible, including but not limited to plastic, metal and glass, forming an extreme low profile light emitter based on nanowires membrane.

EXAMPLES

In the following examples, direct growth of high-quality, high-density InGaN/GaN Qdisks-in-nanowires is demonstrated for facile formation of high-power LEDs on commercial polycrystalline molybdenum substrates formed via molecular beam epitaxy (MBE) using titanium as an interlayer. The method can utilize the effective heat-sinking and electrical conductivity properties of the metal substrate, as well as the inherent formation of TiN as a buffer layer for growing wurtzite structures,[24,25] and ohmic contact for n-GaN,[22,26] thereby greatly simplifying the subsequent fabrication process. The metallic nitrided titanium, as an integral layer of a light-emitting device is also a good reflector for long visible wavelengths.[27,28]

Extensive characterization and growth mechanism studies of the InGaN/GaN Qdisks were performed in nanowire using commercial polycrystalline molybdenum substrates. The results based on the full-width at half-maximum (FWHM) values of 396 arcsec in X-ray diffraction (XRD) rocking curve RC spectra of the GaN(0002) reflection, as well as photoluminescence (PL) and Raman spectroscopy measurements, demonstrated that the nanowires were of high structural and optical quality. These nanowires were mostly N-polar. Furthermore, the transmission electron microscopy (TEM) results confirmed the epitaxial relationship between the nanowires and the TiN transition layer. InGaN/GaN Qdisks-in-nanowires LEDs with a long visible wavelength of 705 nm operating at a unprecedented low turn-on voltage of ~2 V and high injection current of 500 mA were demonstrated, potentially closing the "green gap" when indium compositions were varied. The results of growing high quality InGaN/GaN Qdisks-in-nanowire on all-metal structure highlight the use of this technique for design and fabrication of scalable, low-cost, high-power nanowire devices for solid-state lighting, visible light communication and energy harvesting devices based on photovoltaic and piezoelectric effects.

The devices are also applicable to water splitting and chemical/biological sensing due to the high specific surface of the nanowires devices once functionalized.[29] The use of a titanium interlayer is amenable to a reusable substrate technology for the formation of low profile display devices and flat panel display units on both rigid and flexible devices, since titanium can be used as a sacrificial layer to chemically lift-off the nanowires devices, and yet retain the TiN metal n-contact. The nanowires density can be reduced so single-photon emitters and vertical nanowires transistors can be fabricated for quantum computing, and high speed transistors applications, respectively. Use of the nanowires as transistors can fulfil the current requirements in Moore's law in which high density transistors for multiple functionalities (switches, electronic-optic conversion, and sensing, etc.) can be integrated and realized.

The nanowires samples were grown on commercial polycrystalline molybdenum substrates with dimensions of 1 cm×1 cm×0.05 cm using Veeco Gen 930 plasma-assisted MBE system. A 500-nm layer of titanium was deposited on the molybdenum substrates using an electron beam evaporator before it is loaded into the MBE chambers. The growth temperature was monitored using a pyrometer based on the emissivity of molybdenum. The plasma source was operated at 350 W using a constant N2 flow rate of 1 standard cubic centimeter per minute (scan). To study the growth mechanism, GaN nanowires were grown on molybdenum substrates for 2 hours under varying conditions. The Qdisks in nanowire were composed of ~150 nm n-type GaN grown at 660° C., 8 pairs of InGaN-disks (~3 nm)/GaN-barrier (12 nm) grown at 480° C. with Ga and In fluxes of $3 \times 10^{-8}$ Torr. Before growth, the surface morphology of the substrates was examined using an Agilent 5500 atomic force microscopy (AFM).

After growth, the nanowires were characterized using an FEI Quanta 3D FEG field emission scanning electron microscope (FE-SEM). For TEM characterization, the nanowires were simply scratched onto a holey carbon-coated TEM copper grid. High-angle annular dark field scanning transmission electron microscopy (HAADF-STEM) and annular bright field (ABF) STEM were performed at an acceleration voltage of 300 kV using a probe-corrected FEI Titan equipped with a high-brightness field emission gun (XFEG) and a CETCOR corrector from CEOS.

To study the interface between the nanowires and the substrates, a cross-sectional TEM sample was cut using a lift-out technique in an FEI Helios NanoLab 400s Dual Beam focused ion beam (FIB)/SEM equipped with an Omniprobe to get a row of nanowires roughly oriented along [0002].[30] TEM images were obtained with an FEI Titan 80-300 kV (ST) with the field-emission gun operating at 300 kV. Raman measurements were carried out on a Horiba Jobin Yvon confocal micro-Raman using 473-nm and 325-nm laser excitation sources in the backscattering geometry. Micro-photoluminescence (μPL) measurements were performed using a 325-nm and 473-nm excitation laser at room temperature (RT) and 77 K. θ-2θ and rocking-curve XRD scans were used to examine the crystal quality of the nanowires using a Barker D8 Discover diffractometer with Cu Kα radiation at an applied power of 40 kV×40 mA. The reflectivity of the material was studied using a Shimadzu UV-3600 UV-VIS-NIR spectrophotometer. The NW-LEDs with chip areas of 200 μm in diameter were fabricated similar to a previous report. The light power-current (L-I), current-voltage (I-V) characteristics and electroluminescence (EL) spectra of the NW-LEDs were measured under direct current (DC) injection using a microscope based EL system integrated with a Keithley 2400 source meter, a Newport power meter (Model 2936-C) and an Ocean Optics QE65000 spectrometer. The light output power was measured from the top of the NW-LEDs, through an optical microscope objective, using a calibrated silicon photodiode connected to the optical power meter.

Figure 3A:
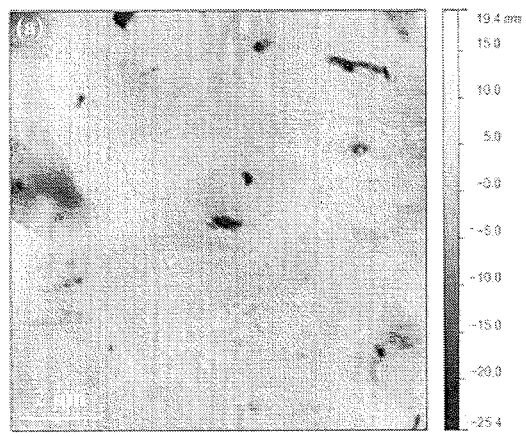
FIGS. 3A-3F depict AFM micrographs (10×10 μm$^2$) of (a) the molybdenum substrates (FIG. 3A) and (b) 500-nm-thick titanium on the molybdenum substrates (FIG. 3B); (c) the plane-view (FIG. 3C) and (d) elevation-view (FIG. 3D) SEM images of the Qdisks in nanowires, with the elevation-view image taken from the edge of the molybdenum substrate; (e) the XRD profiles of the nanowires samples (FIG. 3E); and (f) rocking curve of GaN (0002) planes (FIG. 3F).
Figure 3B:
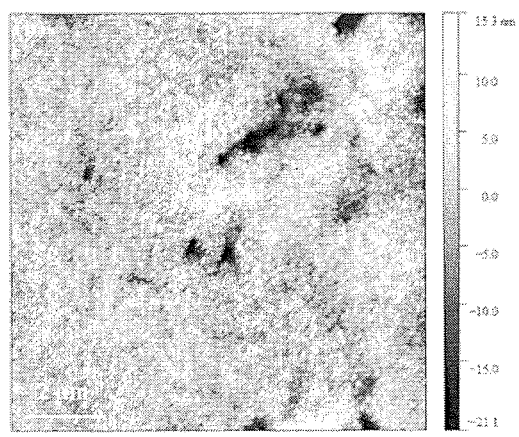
Figure 3C:
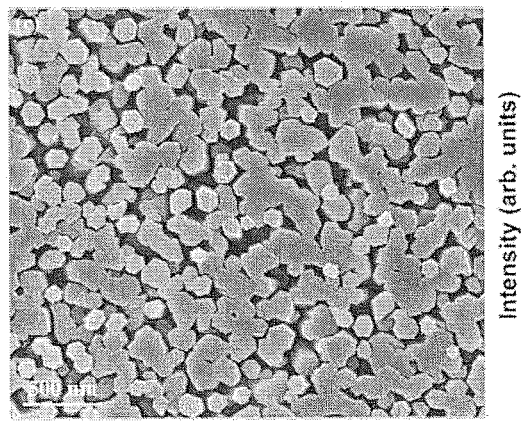
Figure 3D:
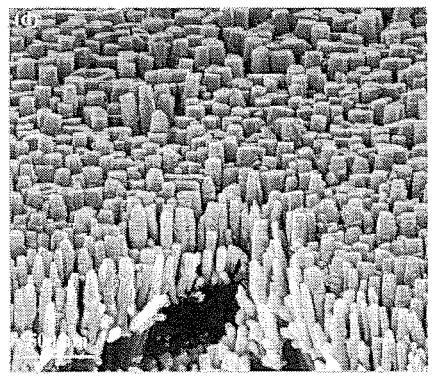

The surface morphologies of the molybdenum substrates and the titanium-coated molybdenum substrates were examined using AFM. As shown in FIG. 3A, the molybdenum substrates showed a root-mean square (RMS) roughness of 8.5 nm with deep pits on the surface. The AFM image in FIG. 3B shows the titanium-coated (500 nm) molybdenum after undergoing thermal cycles up to the growth temperature in the MBE growth chamber. The titanium layer has a lateral grain size of 50-70 nm and RMS roughness of 6.1 nm, and the deep pits were partially covered by the grains. The 500-nm-thick titanium interlayer and the associated grain size were chosen to avoid severe coalescence between the nanowires, as will be discussed later. Despite the rough surface of the titanium-coated molybdenum substrate, the nanowires were grown vertically and exhibited the hexagonal shape associated with the wurtzite crystal structure under optimized growth conditions (see FIG. 3C and FIG. 3D). The nanowires have lateral size of 40-110 nm with density of $1.1 \times 10^{10}$ cm$^{-2}$ essential for LEDs application. The average length of the nanowires was ~300 nm, and a general inverse tapering shape was observed from the bottoms to the tops of the nanowires with some degree of coalescence, as shown in FIG. 3C, due to the lower growth temperature during the top GaN and Qdisks growth.[7] The suppression of coalescence can be further realized if one considers separating the nucleation and growth processes of the nanowires.[31]

Figure 3E:
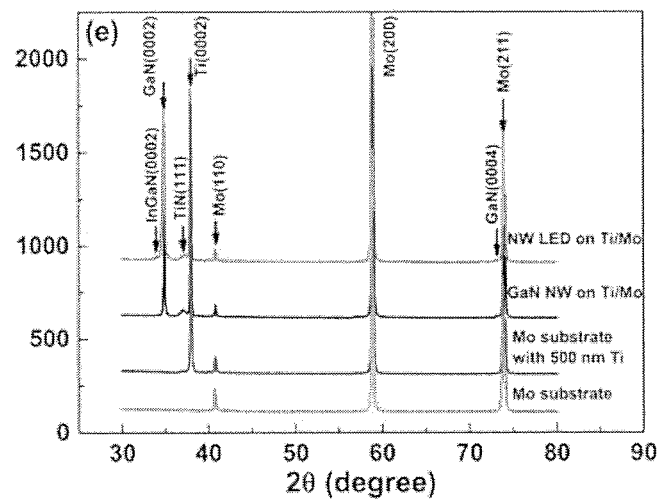

FIG. 3E shows the XRD results of the bare molybdenum substrate, molybdenum substrate with 500-nm titanium, GaN nanowires grown on Ti/Mo, and InGaN/GaN Qdisks in nanowires grown on Ti/Mo. Mo(110), (200) and (211) peaks were observed from the polycrystalline molybdenum substrate. With titanium coating, a preferential (0002) crystalline orientation was measured because the plane has the lowest surface energy.[18] Alter GaN growth, the Ti(0002) peak remained, and TiN(111), GaN(0002) and GaN(0004) peaks were obtained, confirming the surface nitridation of the titanium layer and formation of a TiN layer at the beginning of nanowire growth because of the strong reactivity of N with Ti. The measured Ti(0002), TiN(111) and GaN(0002) peaks in θ-2θ scan indicate that these planes were parallel to each other according to Bragg's law.

Figure 3F:
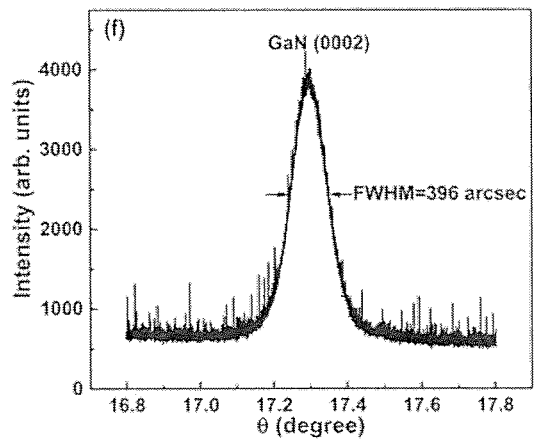

The rocking curve (θ scan) of the GaN nanowires (see FIG. 3F) gave the GaN(0002) reflection's FWHM values of 396 arcsec. This value is smaller than those reported for GaN nanowires grown on crystalline silicon, amorphous silicon nitride, crystalline silicon nitride, and other substrates (see Table 1),[32-35] indicating better crystal quality and vertical ordering of the nanowires. The InGaN(0002) reflection for the InGaN/GaN Qdisk nanowires grown on Ti/Mo was also observed.

Table 1

Summary of GaN nanowires grown on different substrates and the FWHM of the GaN(0002) reflection peak.

| Substrate | FWHM (arcsec) | Reference |
|---|---|---|
| Ti/Mo | 396 | herein |
| crystalline silicon nitride | 410 | 32 |
| amorphous silicon nitride | 890 | 32 |
| bare Si | 810 | 32 |
| bare Si(111) | 1440 | 33 |
| AlN-buffered 6H-SiC(000-1) | 5760 | 33 |
| Si(1 1 1) | 14072.4 | 34 |
| Si(0 0 1) | 18374.4 | 34 |
| Ni-covered sapphire | 5025.6 | 34 |
| c-sapphire | 900 | 34 |

Figure 4B:
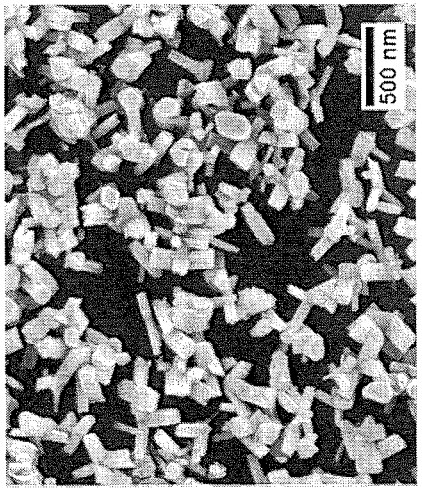
FIGS. 4A-4H depict plane-views (FIGS. 4A-4D) and elevation-views (FIGS. 4E-4H) of SEM images of the GaN nanowires grown on Ti/Mo substrates with different thicknesses of Ti interlayer.
Figure 4D:
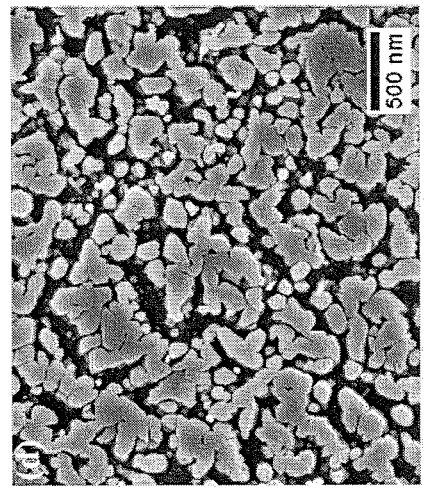
Figure 4A:
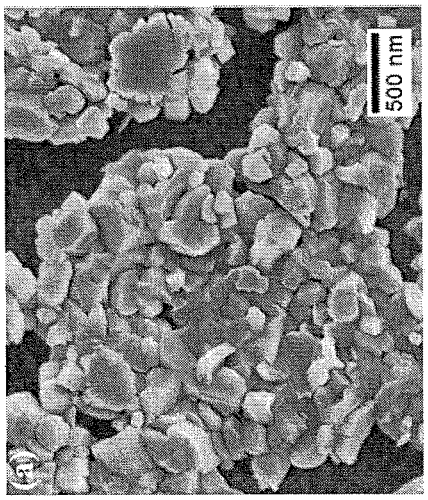
Figure 4C:
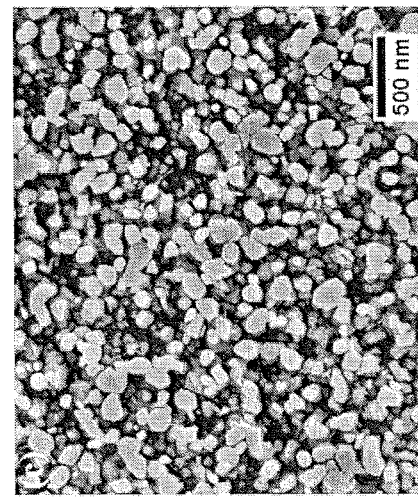
Figure 4F:
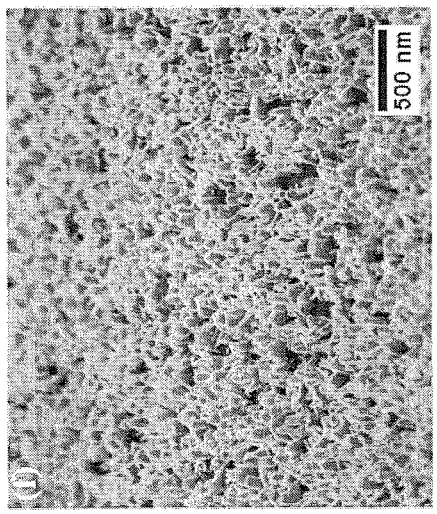
Figure 4H:
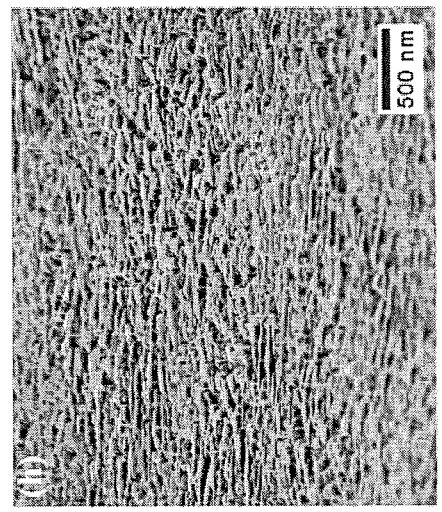
Figure 4E:
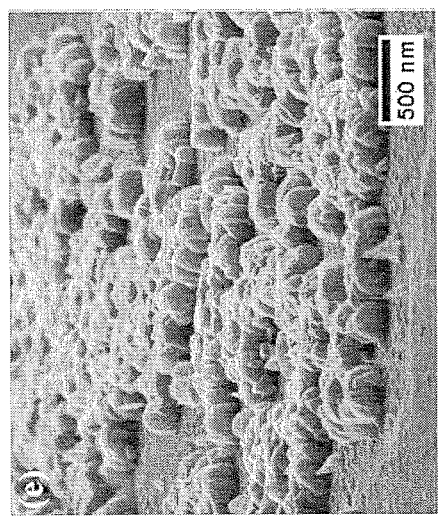
Figure 4G:
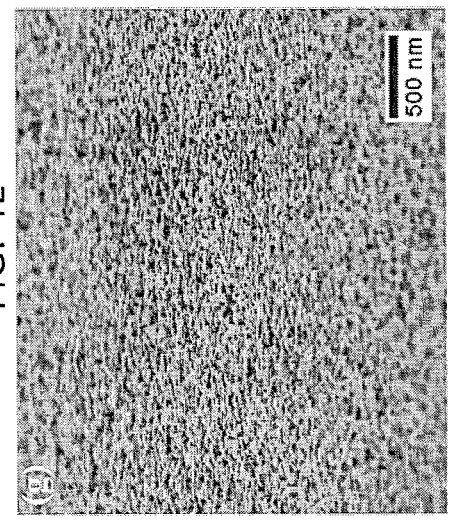

The effect of the titanium interlayers on the growth of nanowires can be found in FIGS. 4A-4H. FIGS. 4A-4H show plane-views (FIGS. 4A-4D) and elevation-views (FIGS. 4E-4H) of SEM images of the GaN nanowires grown on Ti/Mo substrates with different thicknesses of Ti interlayers from 0 to 1 μm. The substrate temperature was fixed at 640° C., the Ga flux was 2.5×10$^{-8}$ Torr, the plasma source was operated at 350 W using a constant N$_2$ flow rate of 1 standard cubic centimeter per minute (sccm). Without Ti interlayer, no GaN nanowire can be formed directly on the surface of the Mo substrates, as shown in FIGS. 4A and 4E. With the Ti interlayer increasing from 50 nm to 500 nm, the density and size of the nanowires increased (see FIGS. 4B and 4C). With a Ti interlayer of 1 μm, serious coalescence happened between the nanowires as shown in FIG. 4D. The formation of the nanowire can be closely related to the TiN grains at the beginning of the growth. The thicker Ti interlayer nitrided by the nitrogen plasma species may lead to the formation of a TiN transition or buffer layer with larger grain size.[56] As a result, nanowires with larger diameter formed at the same growth conditions when the Ti interlayer was thicker as shown in FIG. 4D.

Figure 5B:
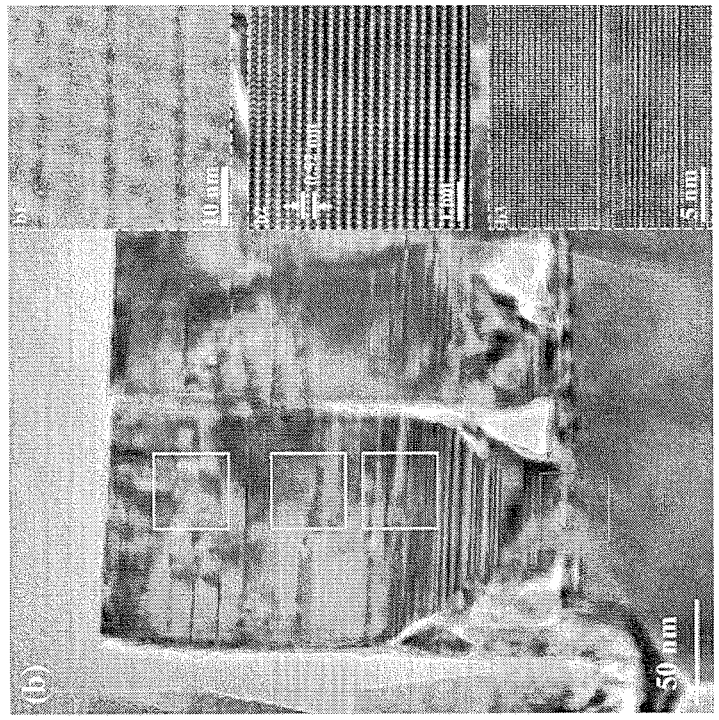
FIGS. 5A-5D depict (a) Typical TEM image of nanowires on Ti/Mo (FIG. 5A); the inset of FIG. 5A shows the SAED pattern of the nanowires; (b) high-magnification TEM image of nanowires on Ti/Mo substrates (FIG. 5B); HRTEM image of (b1) Qdisks and (b2) GaN nanowire are also shown in FIG. 5B; (b3) of FIG. 5B shows the root of the nanowire taken along [2-1-10] zone axis; (c) HRTEM image of the interface between the nanowires and Ti (FIG. 5C), indicated by the lower square on the left side in FIG. 5B; the EDX and EELS line-profile across the interface is also shown; (d) FFT of the square area in FIG. 5D; the inset of which shows a schematic plane-view of the epitaxial relationship between GaN (0002) and TiN (111).
Figure 5A:
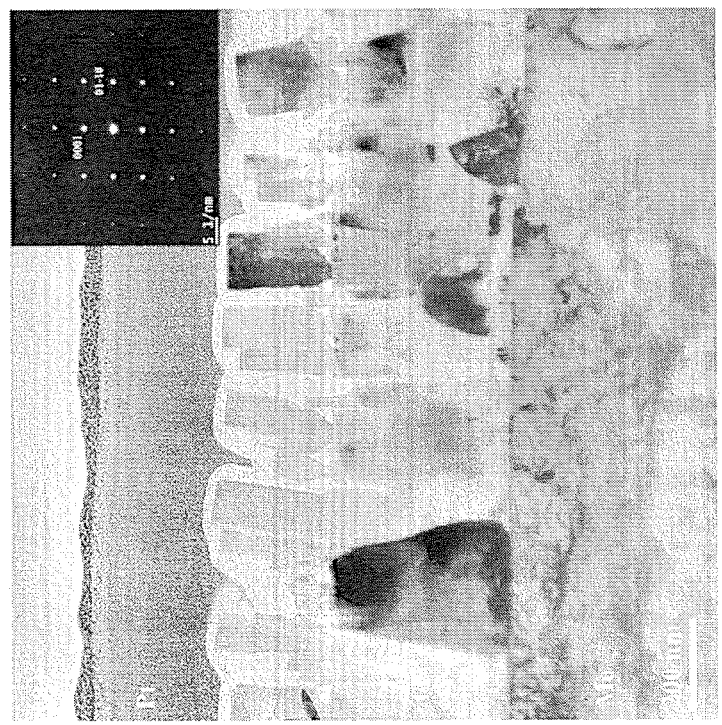
Figure 5D:
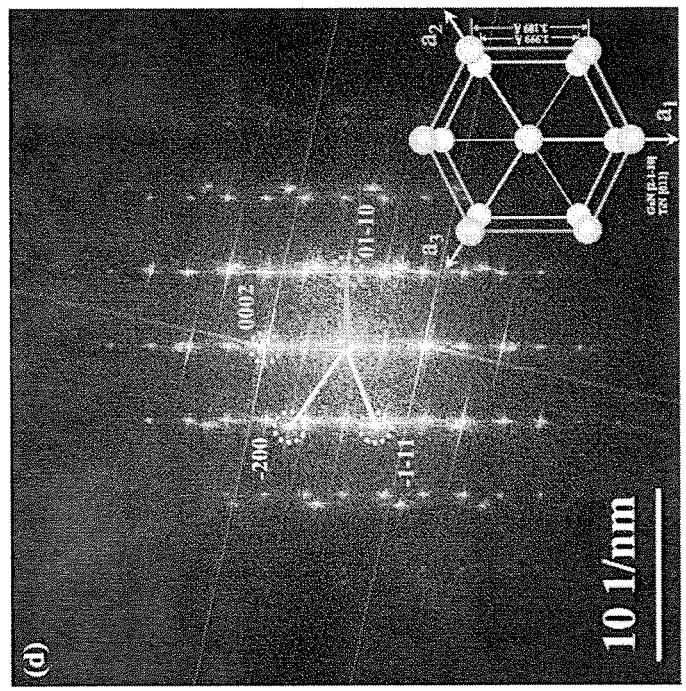
Figure 5C:
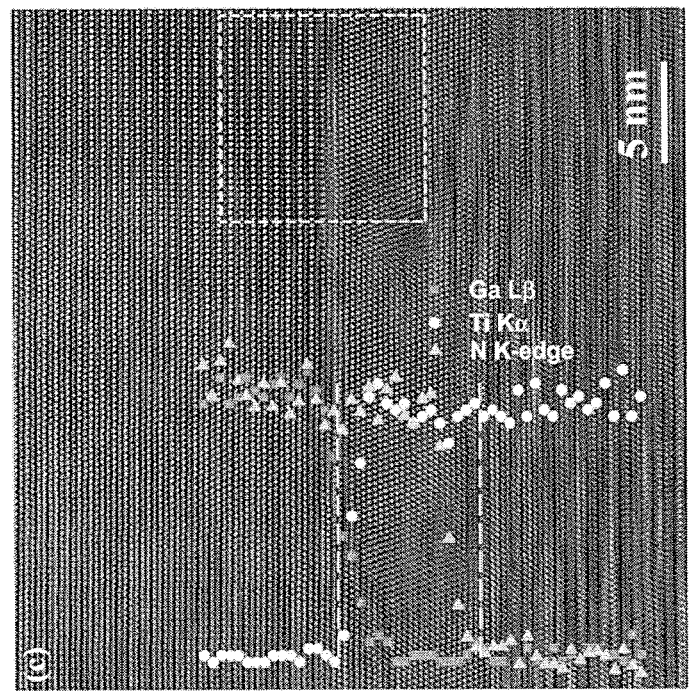

The role of the TiN transition layer in the growth mechanism of GaN nanowires was further examined by observing the nanowires/substrate interface using cross-sectional TEM, FIG. 5A shows a TEM image of the interface with visible molybdenum grains, on top of which the titanium layers with preferred orientation were deposited and the nanowires grown vertically. The inset of FIG. 5A shows the selective area electron diffraction (SAED) pattern of the [2-1-10] zone axis of the nanowire scratched from the substrate, which exhibited the single-crystalline nature of the GaN nanowire. FIG. 5B shows the high-resolution TEM (HRTEM) image of nanowires taken along the [2-1-10] zone axis, which showed the stacking faults confined at the roots of the nanowires. An HRTEM image of the 3-nm InGaN Qdisks/12-nm GaN barrier, which is the active region of a light-emitting device, is shown in the inset of FIG. 5B1. As shown in FIG. 5B2, the measured lattice constant of ~5.2 Å is in good agreement with the reported value for wurtzite GaN crystal along [0001], which was parallel to the long axis of the nanowire, thus confirming the [0001] growth direction of the nanowires. FIG. 5B3 shows the transition region from the stacking fault area to the defect free area of the nanowires. The GaN/Ti interface is shown in FIG. 5C, which clearly shows a 6-nm transition layer. In addition, the element distribution from EDX scan of Ga and Ti and the EELS scan of N across the interface, as shown in the inset of FIG. 5C, confirmed that the transition layer was TiN. The measured lattice spacing of 2.45 Å for the transition layer is in good agreement with the known value of face-centered cubic TiN crystal along [111]. By examining the Miller index in the Fast Fourier Transform image shown in FIG. 5d, the epitaxial relationships of [2-1-10]GaN//[011]TiN plus (0002)GaN//(111)TiN for GaN nanowires/TiN were obtained. The inset in FIG. 5D further illustrates the growth of GaN (0002) lattice on TiN (111) using a ball-and-stick diagram, with the green and brown balls denote the lattice points of GaN and TiN, respectively; the results are consistent with the XRD results.

To study the growth evolution, GaN nanowires were grown on molybdenum substrates for 2 hours under different conditions and then characterized using SEM and Raman spectroscopy. FIGS. 6A-6E show the plane-view SEM images of the GaN nanowires grown on Ti/Mo substrates at temperatures from 560° C. to 720° C. at an interval of 40° C. The elevation-views of SEM images of GaN nanowires grown at different temperatures can be found in FIGS. 7A-7E. The gallium flux was fixed at 5×10$^{-8}$ Torr. When grown at 720° C., low-density nanowires and branched nanostructures coexisted, as shown in FIG. 6A and the inset, which was attributed to the high growth temperature induced high gallium desorption rate and possible GaN decomposition. Similar branched structures have been reported when growing crystals following the seeded growth mechanism, in which the growth of wurtzite branches along the c-axis is introduced by stacking faults along the {111} facets of a seed with cubic phase.[36,37]

Consistently with results from these reports, the nanowires were nucleated on top of the stacking faults/nitrided Ti seeds with {111} facets parallel to the sample surface, as shown in XRD and TEM results. Because the substrate surface is rough, it is possible that there are seeds with {111} facets that are not parallel to the surface. The branched nanostructure shown in FIG. 6A was thus introduced by the stacking faults along the {111} facets of these grains. This result was also verified when the process described herein was transferred to smooth silicon substrates, in which the branched nanostructures were missing (see discussion below in relation to FIG. 8). As the temperature decreased, the densities of the nanowires and nanostructures both increased, as shown in FIGS. 6B and 6C. However, because of the limited space between the nanostructures, the growth of the branched nanostructures was hindered by the surrounding nanostructures, promoting only the growth of vertical nanowires. At growth temperature of 600° C., the diffusion of Ga atoms was limited along the sidewalls, thus resulting in the enhanced lateral growth, and coalescence of GaN islands (see FIG. 6D). At the lowest growth temperature of 560° C., only large area two-dimensional GaN fragments were observed (see FIG. 6E).

The quality of the GaN nanowire-crystals was further verified using Raman spectroscopy based on the different penetration depth of both 325-nm and 473-nm laser excitation. FIG. 6J shows the typical Raman spectra of the nanowires measured in the back scattering configuration. The first-order phonon frequency $E_1(TO)$ at 553.4 cm$^{-1}$, E2 high-frequency mode E2(high) at 565.5 cm$^{-1}$ and longitudinal optical (LO) phonon mode A1(LO) at 733.1 cm$^{-1}$ were observed, which are attributed to hexagonal GaN.[38] A large enhancement in A1(LO) mode was observed when using 325-nm laser excitation, which was attributed to the strong electron-phonon Fröhlich interaction when the exciting energy was near the band gap energy of GaN.[39,40] The prominent broad structure at the low-frequency side of the $E_1(TO)$ peak when using 473-nm laser excitation was attributed to the disturbance of long-range order of GaN caused by the stacking fault at the root of the nanowires, as shown by the TEM results.[41] In the current back-scattering configuration, $E_1(TO)$ was supposed to be forbidden by the Raman selection rules, which were weakened because of the disorder caused by the stacking faults in the nanowires. The $E_2$(high)/$E_1$(TO) intensity ratio can thus be used as a measure of the defects, and the nanowires.[42,43] The dependences of $E_2$(high)/$E_1$(TO) intensity ratio and $E_2$(high) FWHM on the growth temperature are shown in FIG. 6K. With increasing growth temperature, the E(high)/$E_1$(TO) intensity ratio increased from 2.5 to 6.8, and the FWHM of the $E_2$(high) mode became narrower, decreasing from of 9.7 cm$^{-1}$ to 4.8 cm$^{-1}$; this behavior can be attributed to the higher crystalline quality. In contrast, the samples grown at low temperatures showed low $E_2$(high) mode intensities with large FWHM because of the coalesced nanowires and GaN fragments, as shown in FIGS. 6D and 6E, which deteriorated the material quality.

Figures 6F, 6G:
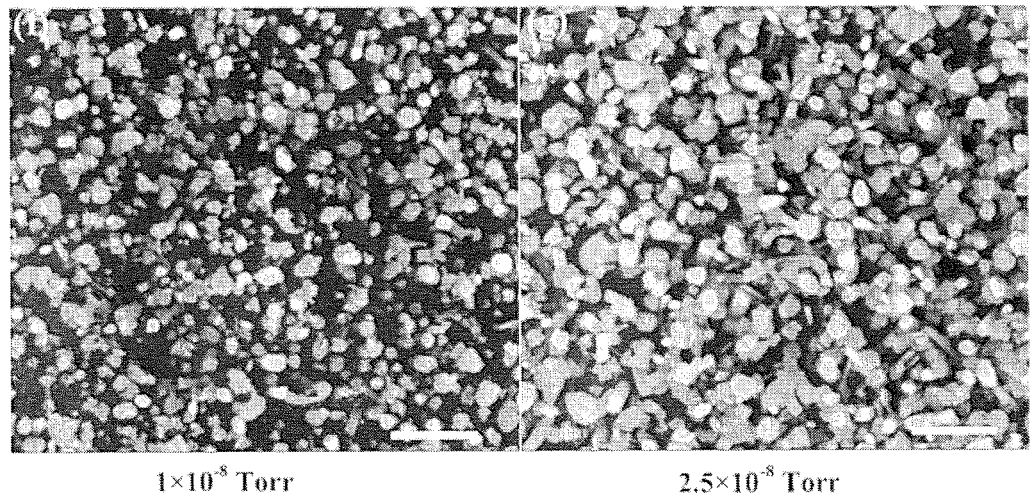
Figures 6H, 6I:
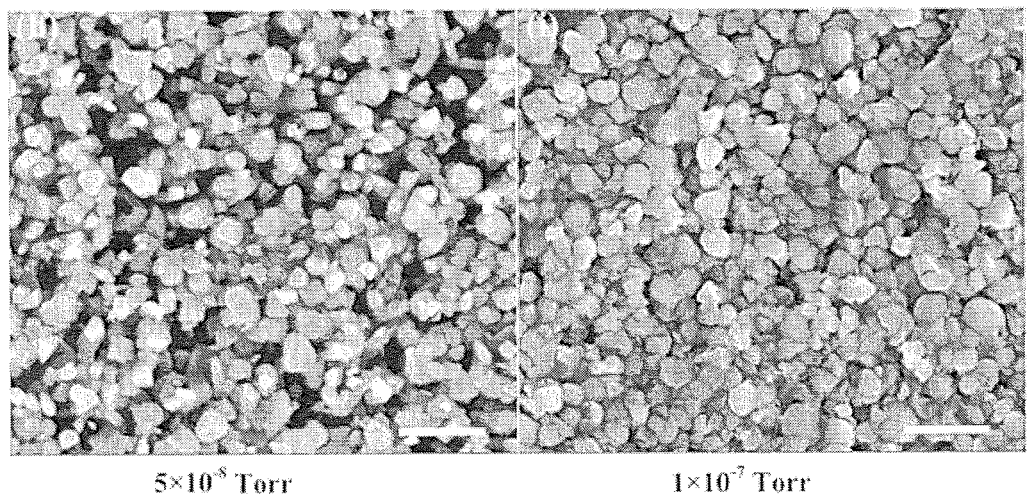
Figures 6J, 6K:
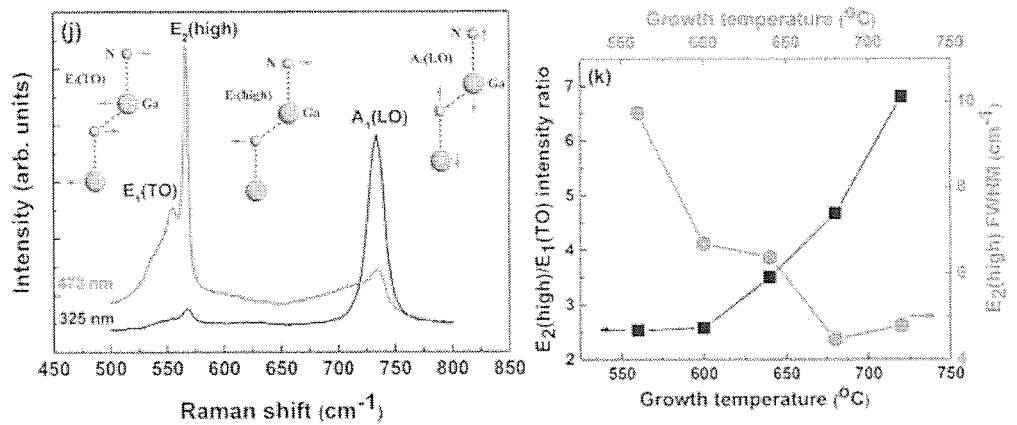

FIGS. 6F-6I show plane-view SEM images of the GaN nanowires grown on Ti/Mo substrates with varying gallium flux from 1×10$^{-8}$ Torr to 1×10$^{-7}$ Torr (for elevation-views of SEM images of GaN nanowires grown with different gallium fluxes are shown in FIGS. 7F-7I). The substrate temperature was fixed at 640° C. When grown using a gallium flux of 1×10⁻⁸ Torr, the densities of nanowires and branched structures were low, as shown in FIG. 6F, because of the limited number of GaN nuclei on the surface. With increasing gallium flux, the number of nuclei increased, leading to the formation of higher density nanowires and branched structures. It is evident the size and density of the nanowires can be tuned by temperatures or fluxes or both.

Figures 6L, 6M:
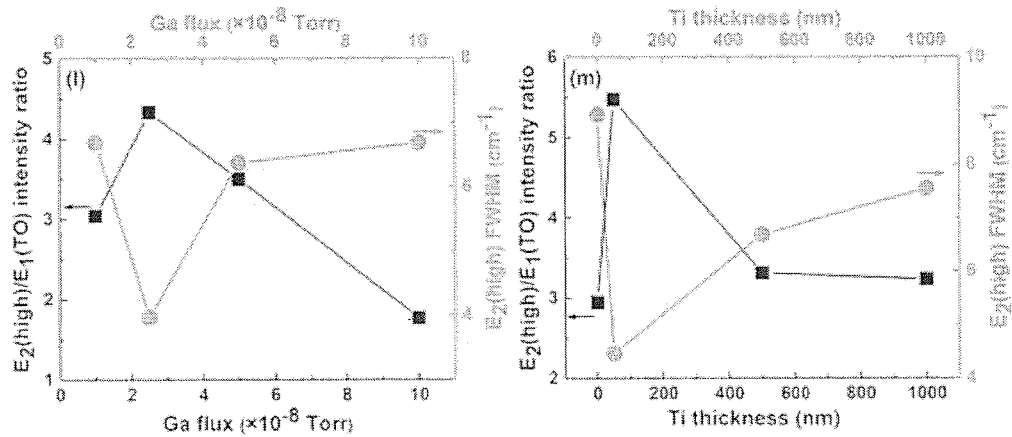
Figure 7F:
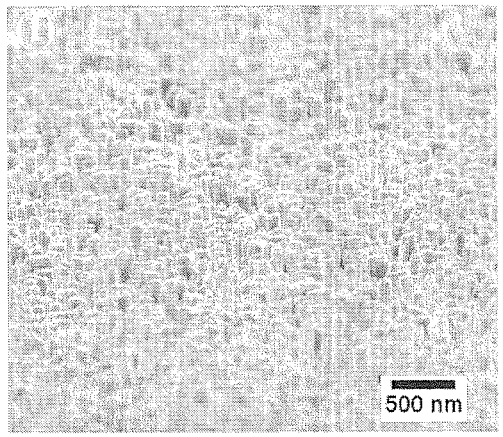
Figure 7G:
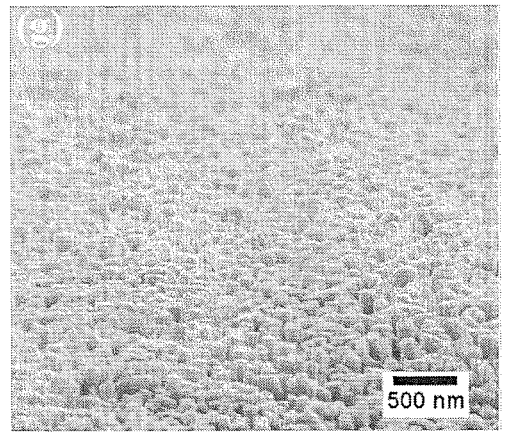
Figure 7H:
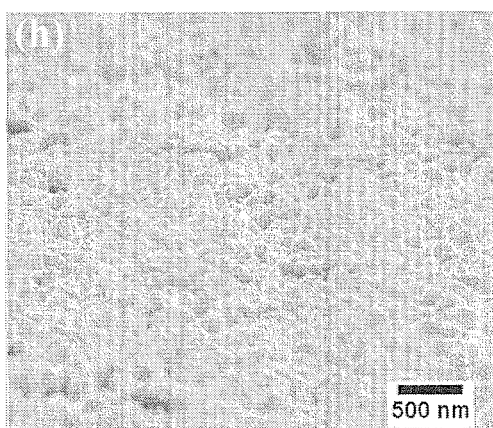
Figure 7I:
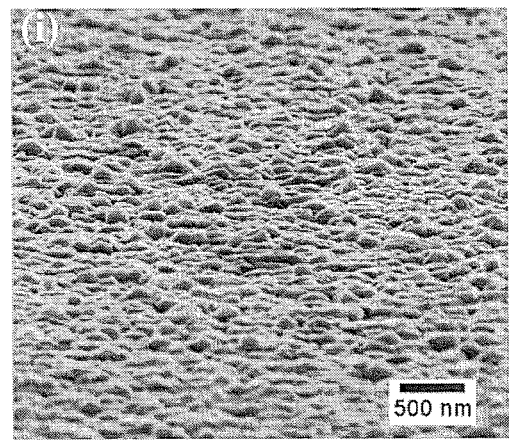

Because of the different diffusion lengths of Ga and N atoms along the sidewalls of the nanowires, the Ga atoms on top of nanowires can be more than N atoms despite the N-rich conditions during the growth.[44] As a result, the radial growth of the nanowires was promoted, thereby increasing the diameters of the nanowires as the gallium flux increases, as shown in FIG. 6G. At a gallium flux of 5×10⁻⁸ Torr, the coalescence of adjacent nanowires became apparent. At a gallium flux of 1×10⁻⁷ Torr, the extensive coalescence of nanowires led to the formation of a compact GaN layer with islands. The dependences of the $E_2$(high)/$E_1$(TO) intensity ratio and the $E_2$(high) FWHM on the gallium flux are shown in FIG. 6L. At a low Ga flux of 1×10⁻⁸ Torr, the nanowires densities and growth rates were limited,[45] and the Raman modes were mainly influenced by the stacking faults at the interface between the nanowires and the titanium interlayer. With increasing Ga flux, the N/Ga ratio decreased, which enhanced the lateral growth, leading to coalescence in the gap area between nanowires and, finally, the formation of rough GaN surface with islands. The defects formed in this process thus caused a decrease of $E_2$(high)/$E_1$(TO) intensity ratio from 4.3 to 1.8 and a broadening of the $E_2$(high) mode peak from a FWHM of 4.0 cm⁻¹ to 6.7 cm⁻¹. The dependences of $E_2$(high)/$E_1$(TO) intensity ratio and the E2(high) FWHM on the titanium thickness are shown in FIG. 6M; without the titanium interlayer, the structures grown on molybdenum show weak and broad $E_2$(high) mode peak, indicating the low crystal quality of the random structures, as shown in FIGS. 4A and 4E. With the titanium interlayer, high-quality nanowires were formed with narrow and intense $E_2$(high) mode peak. Because the nanowires were grown on the TiN transition layer, as shown by TEM, the $E_2$(high) mode peak was weak and broad because of the coalescence-induced defects resulting from the large diameter of the nanowires.

Figure 8A:
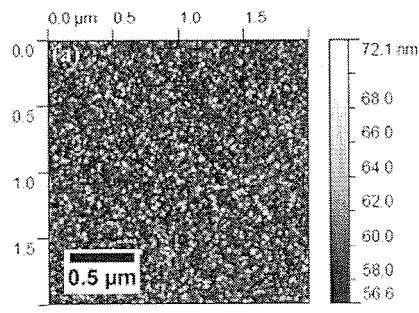
FIGS. 8A-8F depict (a) AFM micrographs (2×2 μm$^2$) of 100 nm Ti on the Si substrate at the growth temperature of 760° C.
Figure 8B:
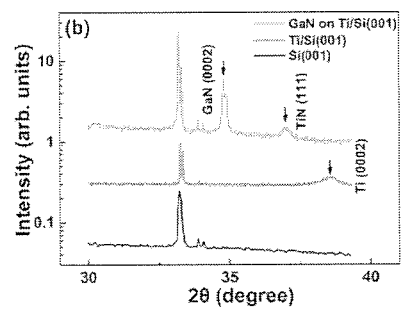
Figure 8C:
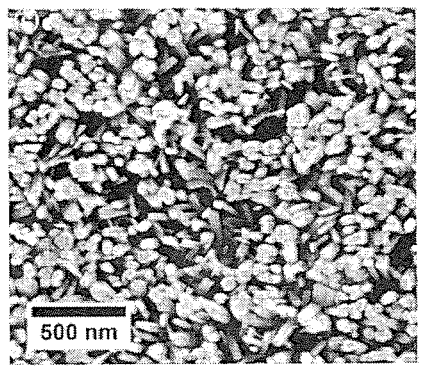
Figure 8D:
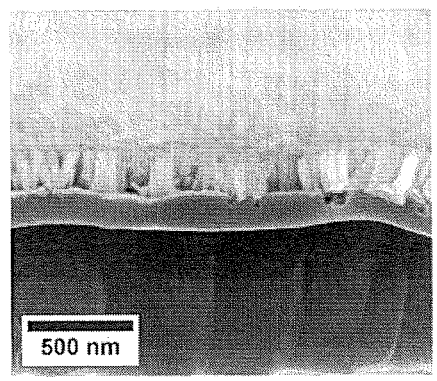
Figure 8E:
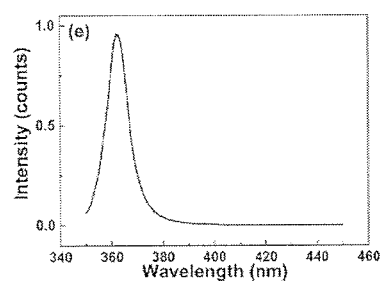
Figure 8F:
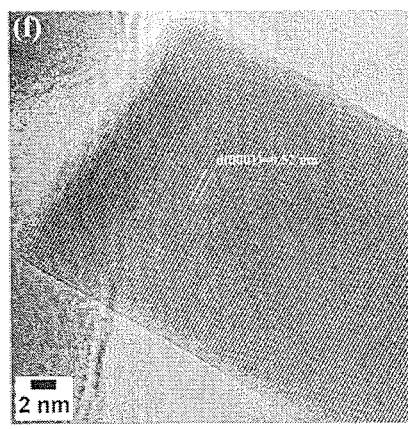

The GaN nanowire was also grown on (001) Si substrates by plasma-assisted molecular beam epitaxy (PAMBE), as depicted in FIGS. 8A-8F. Before loading, a layer of 100 nm Ti was deposited on Si substrates using an electron beam evaporator. The growth temperature was monitored by the pyrometer using the emissivity of Ti. The Ti layer exhibits a smooth surface with a root-mean square roughness of 1.52 nm, as show in FIG. 8A. The Ti film evaporated on Si substrates showed a preferential (0002) crystalline orientation. After GaN growth, TiN(111) and GaN(0002) peaks showed, which confirms the surface nitridation of the Ti layer and formation of a TiN layer at the beginning of nanowire growth, as shown in FIG. 8B. The plane-view and elevation-view SEM show images of the GaN nanowires without branched nanostructures (see FIGS. 8C and 8D). The GaN nanowires exhibited strong near-band-edge ultraviolet PL at 3.40 eV (FIG. 8E). The measured lattice-constant in FIG. 8F is about 5.2 Å, in good agreement with the known value of wurtzite GaN crystal along the [0002] direction.

Besides structural quality, polarity can also have an effect on the properties of nanowires and can play a role in device design. Ho Won Jang et al. have found that Ga-polar GaN has larger surface band bending than N-polar GaN.[46] Joon Seop Kwak et al. have reported that the Ti/Al contacts prepared on Ga-polar n-GaN substrates become ohmic after annealing, whereas the contacts on N-polar n-GaN substrate exhibited rectifying current—voltage curves,[47] To design LEDs based on the nanowires grown by a process as described herein, the polarities of large area nanowires were examined based on KOH selective etching of N-polar GaN.[48] The SEM images of the nanowire samples, before and after KOH etching for 2 hours, are shown in FIGS. 9A and 9B. Only a small portion of the nanowires remained after etching, confirming the hypothesis that the majority of the nanowires are N-polar and that the rest are Ga-polar. FIG. 9B clearly shows the remaining nanowires with the triangle-like tips of the nanowires after etching, indicating that the etching process is faster at the tops of the nanowires, hence the nanowires are n-polar. The mixed polarity of the nanowires hence agreed with the result for nanowires on silicon.[48] The nanowires samples after KOH etching retained their golden color.[28] The XRD spectra in FIG. 9C show that the TiN layer was retained, whereas the titanium layer was converted to TiO2 because of oxidation during KOH etching. Similar results have also been reported in the literature.[49] Furthermore, reflectivity measurements showed that the reflectivity crossover point for TiN and Ti spectra is 532 nm; thus the TiN layer can improve the reflectivity for wavelength longer than 532 nm, as shown in FIG. 9D. This is advantageous for LED's emitting at 705 nm such as those as described herein.

Figure 9F:
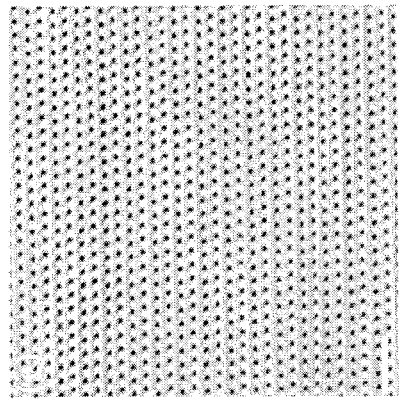
Figure 9G:
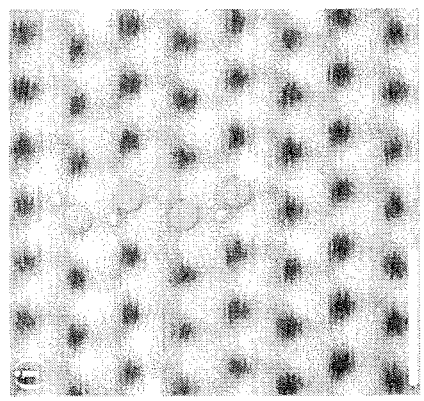
Figure 9H:
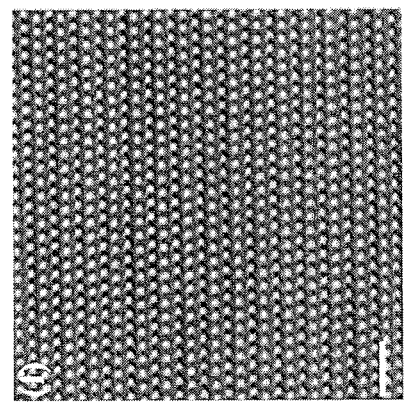
Figure 9I:
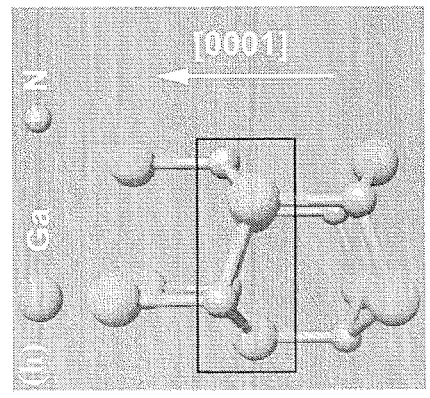
Figure 9E:
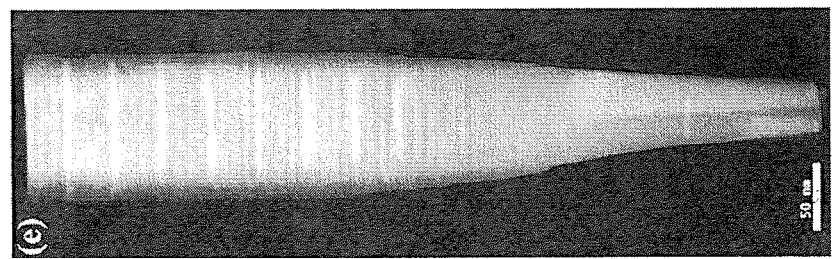

The polarities of randomly selected single nanowire based on TEM were further examined. The HAADF STEM image of InGaN/GaN Qdisks nanowires is shown in FIG. 9E, which provides Z-contrast and therefore differentiates the InGaN Qdisks and GaN barrier. The Qdisks diameters increased along the length of the nanowires because of the increased indium incorporation and lateral growth at lower temperatures. The temperature of substrate was sufficiently stable before the first InGaN Qdisk growth. Otherwise, the first InGaN Qdisk may develop a projected truncated pyramidal shape with thicker semi-polar side facets. The high-resolution HAADF STEM image of GaN nanowires shown in FIG. 9F depicts the atomic columns observed along the [2-1-10] zone axis of the GaN wurtzite crystal, which mainly shows the Ga atoms. The nanowires were also imaged in ABF mode in FIG. 9G because of its high sensitivity to light elements.[50] FIG. 9H shows a schematic of the N-polar c-plane GaN with the wurtzite crystalline structure viewed along [2-1-10] direction. FIG. 9I clearly shows both Ga and N atoms; therefore, the stacking order in the lattice along the growth direction and the polarity were determined.[51] In the case herein, N atoms were on the tops of the Ga—N dumbbells, which confirmed the N-polarity of the nanowires.

Figures 10A, 10B:
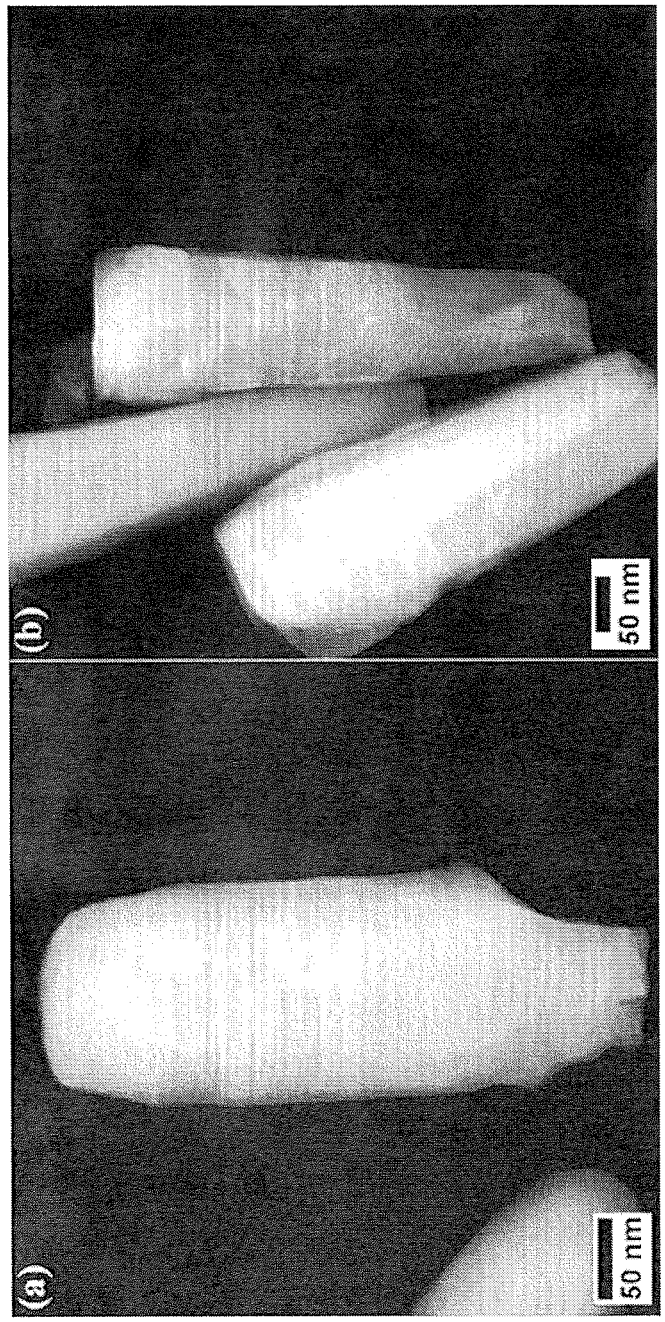
FIGS. 10A-10B depict high-angle annular dark-field images of: (a) InGaN/GaN Qdisks in nanowires grown when the temperature was not stable (FIG. 10A); (b) InGaN/GaN Qdisks in NWs on which GaN was grown first, and followed by InGaN Qdisk (FIG. 10B).

As depicted in FIGS. 10A and 10B the growth condition can have an influence on the shapes of the Qdisks. The growth of Qdisks in nanowire began with ~150 nm n-type GaN grown at 720° C., before the substrate was cooled down to 560° C. for the growth of 8 pairs of InGaN-disk (~3 nm)/GaN-barrier (12 nm). The temperature was stabilized before the first InGaN Qdisks growth to prevent the formation of the truncated pyramidal shape with obvious semi-polar side facets (see FIG. 10A). Under these conditions, unstable nucleation and crystallization occurred at the boundary of the semipolar plane and c-plane when the adatoms reached this region, which led to the generation of the boundary region with unstable surface energies. As a result, the capturing effect of indium adatoms by this region led to the formation of thicker InGaN at the facets. Similar observations have also been reported for the growth of InGaN quantum wells.[57] Instead, a GaN barrier before InGaN Qdisk was also grown, which also avoided the formation of the facet because the growth front was more energy-stable (see FIG. 10B).[58]

Figure 11A:
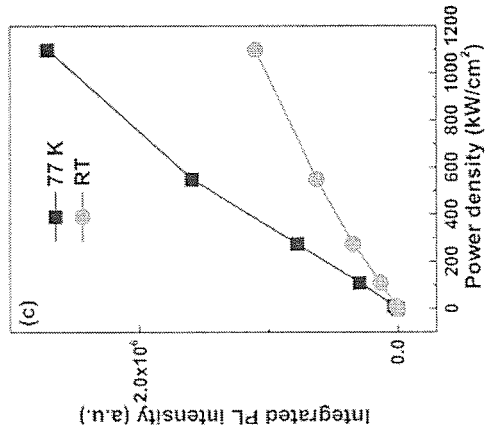
FIGS. 11A-11F depict (a) RT PL spectra for the GaN nanowires (FIG. 11A); the inset shows RT and 77 K PL spectra for InGaN/GaN Qdisks in nanowires; (b) power-dependent PL spectra for InGaN/GaN Qdisks in nanowires measured at RT (FIG. 11B); (c) variation of the integrated FL intensity with excitation power density in InGaN/GaN Qdisks in nanowires at 77 K and RT (FIG. 11O); (d) measured I-V characteristics of the 200 μm diameter LEDs (FIG. 11D); the inset shows the charge-coupled devices (CCD) image for the uniformly illuminated LED; (e) the EL spectra of the LED at different injection currents from 100-400 mA (FIG. 11E); and (f) the relative EQE and L-I characteristics of LEDs (FIG. 11F).
Figure 11B:
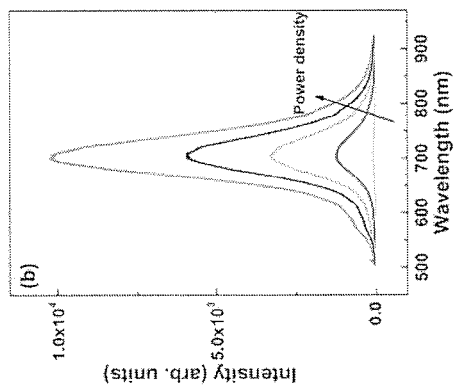
Figure 11C:
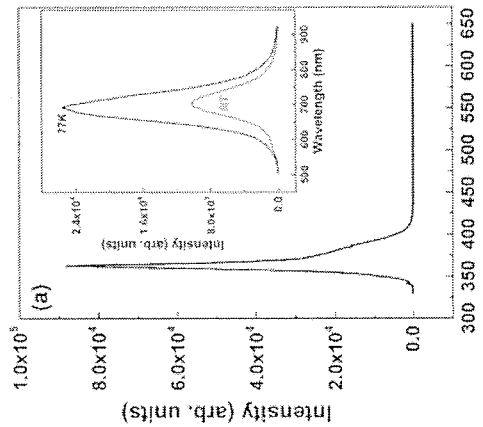

The optical and optoelectronic properties of the GaN nanowires and InGaN/GaN Qdisks in nanowires were also examined. FIG. 11A shows the RT PL of the GaN nanowires, which revealed strong near-band-edge ultraviolet photoluminescence at 3.40 eV with a FWHM of 59 meV and without defect-related emission, indicating high optical quality. This correlates well with the XRD measurements and TEM observations. The InGaN/GaN Qdisk nanowires sample grown on the Ti/Mo substrates showed a golden color because of the TiN layer. The indium composition was meticulously tuned to get an emission wavelength of 701 nm (as shown in the inset of FIG. 11A) to be reflected by the TiN layer below the nanowires. FIG. 11B shows the power dependent PL spectra for InGaN/GaN Qdisks in nanowires measured at RT. The PL peak shift from Qdisks was negligible, suggesting a considerably small polarization field. FIG. 11C shows the variation of the integrated PL intensity with excitation power density in InGaN/GaN Qdisks in nanowires at 77 K and RT. The integrated intensities were larger at 77 K than at RT at all excitation powers because of the lower non-radiative recombination rate at 77 K. The integrated intensity increased with excitation power. At both temperatures, the variation showed smaller slopes when the excitation power density exceeded 550 kW/cm$^2$ because of saturation of the non-radiative centers having lower density of states, and the gradual suppression of the non-radiative recombination.[52]

Figure 11D:
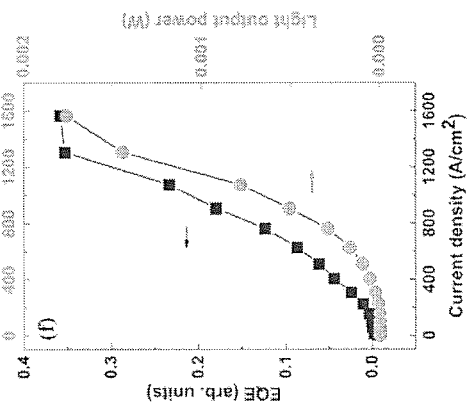
Figure 11E:
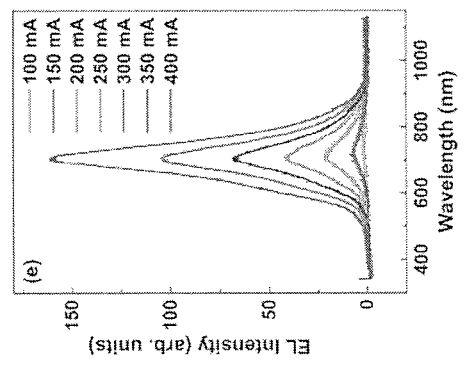
Figure 11F:
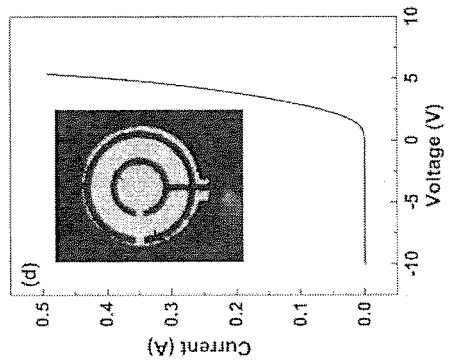

FIG. 11C shows the current-voltage (I-V) characteristics and the optical microscope image of the LED under direct current (DC) injection at room temperature, with a turn on voltage of ~2 V (see Supplementary movie for the operating NW-LED). FIG. 11D shows the room temperature EL spectra of the NW-LEDs at different injection current densities. The ability to tune the peak emission wavelength towards far-red wavelength is evident as shown in FIG. 11E, in which the LED was emitting at around 705 nm and with negligible blue shift in the range of 100-400 mA injection current. FIG. 11F shows the light output power versus current curves (L-I) of the LEDs. The relative external quantum efficiency (EQE) of the LEDs was calculated using the equation next=(P/hu)/(I/e), where P is the light output power of the LED, u is the frequency of the light from the EL wavelength of the LED and I is the injection current, h is Planck's constant, e is the electron charge. The LED does not exhibit efficiency droop at the injection current of 500 mA (1.6 kA/cm$^2$) and ~5 V forward bias voltage, thus exhibiting its potential for high power device operation.

In conclusion, demonstrated herein, for the first time, is the facile growth and fabrication of high-density InGaN/GaN Qdisks-in-nanowire LEDs on commercial bulk polycrystalline molybdenum substrates using MBE. The high-crystal-quality nanowires were grown epitaxially on nitrided titanium transition layers, which formed an integrated n-contact layer and reflector for LEDs. The direct growth of nanowires on molybdenum bulk substrates enables the facile fabrication of high-power light emitters with high thermal and electrical conductivities. Long visible wavelength InGaN/GaN QDisks-in-nanowire can be produced for high-power LED's.

The use of sacrificial Ti interlayer is amenable to LED-epitaxy-lift-off and reusable substrate technologies. The resulting LED membrane is favorable for the formation of low profile light-emitters for display devices and flat panel display units on both rigid and flexible devices. Beyond these applications, the nanowires density can be reduced, by varying growth conditions, to produce single-photon emitters. For electronics application, vertical nanowires transistors can also be fabricated for quantum computing, and high speed transistors applications, respectively. The use of nanowires as transistors and light-emitters may fulfill the current requirements in Moore's law in which high-density transistors for multiple functionalities (switches, electronic-optic conversion, and sensing, etc.) can be integrated and realized. Hence, a practical platform for high power nanowires light emitters and a broad range of multidisciplinary functionalities are provided herein.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

REFERENCES

1 Yan, J. et al. AlGaN-based deep-ultraviolet light-emitting diodes grown on High-quality AlN template using MOVPE. *J. Cryst. Growth* 414, 254-257 (2015).

2 Tsai, M. T. et al. The effect of free-standing GaN substrate on carrier localization in ultraviolet InGaN light-emitting diodes. *Nanoscale. Res. Lett.* 9, 675 (2014).

3 Carter, J. C. H. et al. Progress in SiC: from material growth to commercial device development. *Mat. Sci. Eng. B-SOLID* 61-62, 1-8 (1999).

4 Cheng, J. P. et al. High mobility AlGaN/GaN heterostructures grown on Si substrates using a large lattice-mismatch induced stress control technology. *Appl. Phys. Lett.* 106, 142106 (2015).

5 Mi, Z., Nguyen, H. P. T., Zhang, S., Cui, K. & Djavid, M. in *Proc. SPIE* 8634, *Quantum Dots and Nanostructures: Synthesis, Characterization, and Modeling X.* (eds K. G. Eyink, D. L. Huffaker, & F. Szmulowicz) 86340B.

6 Guo, W., Zhang, M., Banerjee, A. & Bhattacharya, P. Catalyst-Free InGaN/GaN Nanowire Light Emitting Diodes Grown on (001) Silicon by Molecular Beam Epitaxy. *Nano Lett.* 10, 3355-3359 (2010).

7 Zhao, C. et al. An enhanced surface passivation effect in InGaN/GaN disk-in-nanowire light emitting diodes for mitigating Shockley-Read-Hall recombination. *Nanscale*, DOI: 10.1039/C1035NR03448E (2015).

8 Frost, T. et al. Monolithic Electrically Injected Nanowire Array Edge-Emitting Laser on (001) Silicon. *Nano Lett.* 14, 4535-4541 (2014).

9 Jahangir, S. et al. Small signal modulation characteristics of red-emitting ($\lambda$=610 nm) III-nitride nanowire array lasers on (001) silicon. *Appl. Phys. Lett.* 106, 071108 (2015).

10 Ng, T. K. et al. in *CLEO:* 2014. SM2J.2 (Optical Society of America).

11 Hestroffer, K. et al. In situ study of self-assembled GaN nanowires nucleation on Si(111) by plasma-assisted molecularbeam epitaxy. *Appl. Phys. Lett.* 100, 212107 (2012).

12 Arafin, S., Liu, X. H. & Mi, Z. T. Review of recent progress of III-nitride nanowire lasers. *J. Nanophotonics* 7, 074599 (2013).

13 Matthews, J., Hoffmann, E. A., Weber, C., Wacker, A. & Linke, H. Heat flow in InAs/InP heterostructure nanowires. *Phys. Rev. B* 86, 174302 (2012).

14 Jen-Hau, C., Seghete, D., George, S. M., Yang, R. & Lee, Y. C. in *Micro Electro Mechanical Systems (MEMS), 2010 IEEE 23rd International Conference.* 468-471.

15 Feezell, D. F., Speck, J. S., DenBaars, S. P. & Nakamura, S. Semipolar (20(2)over-bar(1)over-bar) InGaN/GaN Light-Emitting Diodes for High-Efficiency Solid-State Lighting, *J. Disp. Technol.* 9, 190-198 (2013).

16 Arik, M., Becker, C. A., Weaver, S. E. & Petroski, J, in *Proc, SPIE* 5187, *Third International Conference on Solid State Lighting.* 64-75 (2014).

17 Schuster, F. et al. Position-Controlled Growth of GaN Nanowires and Nanotubes on Diamond by Molecular Beam Epitaxy. *Nano Lett.* 15, 1773-1779 (2015).

18 Choi, J. H. et al. Nearly single-crystalline GaN light-emitting diodes on amorphous glass substrates. *Nat. Photon.* 5, 763-769 (2011).

19 Yuan, S., Kang, X. J., Wu, D. K., Kang, X. & Wu, D. Gallium nitride semiconductor device, e.g. LEDS, laser diodes, or lighting for light emission, comprises epitaxial layers having active layer for light generation, n-type layer for light transmission, and p-type layer for light reflection. WO2007037762-A1 (2007).

20 Tran, C. A. & Doan, T. T. Fabricating light-emitting diode device involves forming conductive substrate; removing carrier substrate; immersing surface of n-doped layer in electrolytic solution; applying electrical bias; and illuminating surface of the n-doped layer. US2008293171-A1; US7629195-B2 (2008).

21 Lee, S. H., Kim, S. H., Song, Y. H., Jeon, S.-R. & Yu, J. S. Thermal and Optical Properties of InGaN/GaN Green Vertical Light-Emitting Diodes on Molybdenum Substrate for Different Submounts. *Jpn. J. Appl. Phys.* 52, 102102 (2013).

22 Wölz, M. et al. Epitaxial Growth of GaN Nanowires with High Structural Perfection on a Metallic TiN Film. *Nano Lett.* 15, 3743-3747 (2015).

23 Sarwar, A. T. M. G. et al. Semiconductor Nanowire Light-Emitting Diodes Grown on Metal: A Direction Toward Large-Scale Fabrication of Nanowire Devices. *Small*, 10.1002/smll.201501909 (2015).

24 Lin, Y.-R. et al. Buffer-Facilitated Epitaxial Growth of ZnO Nanowire. *Cryst. Growth Des.* 5, 579-583 (2005).

25 Uchida, Y. et al. Epitaxial growth of GaN layers on metallic TiN buffer layers. *J. Electron. Mater.* 35, 1806-1811 (2006).

26 Gautier, S. et al. Optical and electrical properties of TiNin-GaN contacts in correlation with their structural properties. *Semicond. Sci. Tech.* 18, 594-601 (2003).

27 Chen, N. C. et al. Nitride light-emitting diodes grown on Si (111) using a TiN template. *Appl. Phys. Lett.* 88, 191110 (2006).

28 Perry, A. J., Georgson, M. & Ribbing, C. G. The Reflectance and Color of Titanium Nitride. *J. Vac. Sci. Technol. A* 4, 2674-2677 (1986).

29 Kibria, M. G. et al. Tuning the surface Fermi level on p-type gallium nitride nanowires for efficient overall water splitting. *Nat. Commun.* 5, 3835 (2014).

30 Colby, R. et al. Dislocation Filtering in GaN Nanostructures. *Nano Lett.* 10, 1568-1573 (2010).

31 Carnevale, S. D., Yang, J., Phillips, P. J., Mills, M. J. & Myers, R. C. Three-Dimensional GaN/AlN Nanowire Heterostructures by Separating Nucleation and Growth Processes. *Nano Lett.* 11, 866-871 (2011).

32 Kumar, P., Tuteja, M., Kesaria, M., Waghmare, U. V. & Shivaprasad, S. M. Superstructure of self-aligned hexagonal GaN nanorods formed on nitrided Si(111) surface. *Appl. Phys. Lett.* 101, 131605 (2012).

33 Fernandez-Garrido, S. et al. Correlation between the structural and optical properties of spontaneously formed GaN nanowires: a quantitative evaluation of the impact of nanowire coalescence. *Nanotechnology* 25, 455702 (2014).

34 Geelhaar, L. et al. Properties of GaN Nanowires Grown by Molecular Beam Epitaxy. *IEEE J. Sel. Top. Quant.* 17, 878-888 (2011).

35 Kuo, S. Y. et al. Catalyst-free GaN nanorods grown by metalorganic molecular beam epitaxy. *IEEE T. Nanotechnol.* 5, 273-277 (2006).

36 Shiojiri, M. & Kaito, C. Structure and growth of ZnO smoke particles prepared by gas evaporation technique. *J. Cryst. Growth* 52, Part 1, 173-177 (1981).

37 Bakti Utama, M. I. et al. Recent developments and future directions in the growth of nanostructures by van der Waals epitaxy. *Nanoscale* 5, 3570-3588 (2013).

38 Li, C., Bando, Y. & Golberg, D. Current Imaging and Electro migration-Induced Splitting of GaN Nanowires As Revealed by Conductive Atomic Force Microscopy. *ACS Nano* 4, 2422-2428 (2010).

39 Chen, C., Dutta, M. & Stroscio, M. A. Electron scattering via interactions with optical phonons in wurtzite crystals. *Phys. Rev. B* 70, 075316 (2004).

40 Martin, R. M. Theory of the One-Phonon Resonance Raman Effect. *Phys. Rev. B* 4, 3676-3685 (1971).

41 Tabata, A. et al. Comparative Raman studies of cubic and hexagonal GaN epitaxial layers. *J. Appl. Phys.* 79, 4137-4140 (1996).

42 Siegle, H. et al. Quantitative determination of hexagonal minority phase in cubic GaN using Raman spectroscopy. *Solid State Commun.* 96, 943-949 (1995).

43 Dhara, S. et al. Recrystallization of epitaxial GaN under indentation. *Appl. Phys. Lett.* 92, 143114 (2008).

44 Fernández-Garrido, S, et al. Self-Regulated Radius of Spontaneously Formed GaN Nanowires in Molecular Beam Epitaxy. *Nano Lett.* 13, 3274-3280 (2013).

45 Tchernycheva, M. et al. Growth of GaN free-standing nanowires by plasma-assisted molecular beam epitaxy: structural and optical characterization. *Nanotechnology* 18, 385306 (2007).

46 Jang, H. W., Lee, J. H. & Lee, J. L. Characterization of band bendings on Ga-face and N-face GaN films grown by metalorganic chemical-vapor deposition. *Appl. Phys. Lett.* 80, 3955-3957 (2002).

47 Kwak, J. S. et al. Crystal-polarity dependence of Ti/Al contacts to freestanding n-GaN substrate. *App. Phys. Lett.* 79, 3254-3256 (2001).

48 Carnevale, S. D. et al. Mixed Polarity in Polarization-Induced p-n Junction Nanowire Light-Emitting Diodes. *Nano Lett.* 13, 3029-3035 (2013).

49 Prusi, A., Arsov, L., Haran, B. & Popov, B. N. Anodic behavior of Ti in KOH solutions—Ellipsometric and micro-Raman spectroscopy studies. *J. Electrochem. Soc.* 149, B491-B498 (2002).

50 Phillips, P. J., Carnevale, S. D., Kumar, R., Myers, R. C. & Klie, R. F. Full-Scale Characterization of UVLED AlxGa1-xN Nanowires via Advanced Electron Microscopy. *ACS Nano* 7, 5045-5051 (2013).

51 de la Mata, M. et al. Polarity Assignment in ZnTe, GaAs, ZnO, and GaN—AlN Nanowires from Direct Dumbbell Analysis. *Nano Lett.* 12, 2579-2586 (2012).

52 Wang, H. N. et al. Influence of excitation power and temperature on photoluminescence in InGaN/GaN multiple quantum wells. *Opt. Express* 20, 3932-3940 (2012).

53 Tan, B. S.; Yuan, S.; Kang, X. J. Appl. Phys. Lett. 2004, 84, 2757-2759.

54 Edwards, P. R.; Martin, R. W.; Kim, H. S.; Kim, K. S.; Cho, Y.; Watson, I. M.; Sands, T.; Cheung, N. W.; Dawson, M. D. Phys. Status Solidi B 2001, 228, 91-94.

55 Lee, H.-Y.; Huang, X.-Y.; Lee, C.-T. J. Electrochem. Soc. 2008, 155, H707-H709.

56 Höche, D. et al. Microstructure of TiN coatings synthesized by direct pulsed Nd:YAG laser nitriding of titanium: Development of grain size, microstrain, and grain orientation. *Appl. Phys. A* 91, 305-314 (2008).

57 Nguyen, H. P. T. et al. Engineering the Carrier Dynamics of InGaN Nanowire White Light-Emitting Diodes by Distributed p-AlGaN Electron Blocking Layers. *Sci. Rep.* 5, 7744 (2015).

58 Ra, Y.-H., Navamathavan, R., Kang, S. & Lee, C.-R. Different characteristics of InGaN/GaN multiple quantum well heterostructures grown on m- and r-planes of a single n-GaN nanowire using metalorganic chemical vapor deposition. *J. Mater. Chem. C* 2, 2692-2701 (2014).

Therefore, the following is claimed:

1. A method of growing an elemental or compound semiconductor on a metal substrate comprising the steps of:
    providing a metal substrate;
    adding a metal interlayer directly on a surface of the metal substrate; and
    growing semiconductor nanowires on the metal interlayer using a semiconductor epitaxy growth system to form the elemental or compound semiconductor,
    wherein the step of growing semiconductor nanowires forms an entirely nitride layer directly on the metal interlayer, and forms the semiconductor nanowires directly on the entirely nitride layer so that the semiconductor nanowires are not in direct contact with the metal interlayer.

2. The method of claim 1, wherein the metal substrate is a thermally and electrically conductive metal, which is one of Mo, Ta, or W.

3. The method in claim 1, wherein the metal interlayer is comprised of a metal, which is one of Ti, TiN, TaN, HfN, TiAlN.

4. The method of claim 1, further comprising: forming plural quantum disks within the semiconductor nanowires.

5. The method of claim 1, wherein the compound semiconductor includes a III-V compound semiconductor comprising one of GaAs, InP, GaSb, and their related ternary and quaternary compounds, including AlGaAs, InGaP, InGaAs, or InGaAsP.

6. The method of claim 1, wherein the compound semiconductor is a III-N compound semiconductor comprising one of preferably GaN, AlN, InN, InGaN, AlGaN, and their related binary, ternary, and quaternary compound semiconductors.

7. The method in claim 2, the metal substrate is a bulk metal substrate or a metal foil.

8. The method in claim 3, the metal interlayer is deposited on the surface of the metal substrate using a thin film deposition technique, which is one of chemical vapor deposition (CVD), atomic layer deposition (ALD), a sputtering coating technique, pulsed laser deposition (PLD), thermal evaporation, and e-beam evaporation.

9. The method of claim 1, wherein the elemental or compound semiconductor is an all-metal structure.

10. The method of claim 1, wherein the elemental semiconductor includes a silicon or germanium, and/or Si—Ge compound.

11. A semiconductor device, comprising:
    a metal substrate;
    a metal interlayer arranged directly on the metal substrate;
    an entirely nitride layer arranged directly on the metal interlayer; and
    semiconductor nanowires arranged directly on the entirely nitride layer, but the semiconductor nanowires are not in direct contact with the metal interlayer.

12. The semiconductor device of claim 11, wherein the device is an optoelectronic or a photonic device.

13. The semiconductor device of claim 11, wherein the device is a high electron mobility transistor (HEMT), a heterojunction bipolar transistor (HBT), or a field effect transistor (FET).

14. The semiconductor device of claim 11, further comprising plural quantum disks formed within the semiconductor nanowires.

15. A method of forming a semiconductor device, the method comprising:
    forming a metal interlayer directly on a metal substrate; and
    forming an entirely nitride layer directly on the metal interlayer by forming semiconductor nanowires on the metal interlayer,
    wherein the semiconductor device comprises the semiconductor nanowires formed directly on the entirely nitride layer and the semiconductor nanowires are not in direct contact with the metal interlayer.

16. The method of claim 15, further comprising:
    forming plural quantum disks within the semiconductor nanowires.

17. The method of claim 15, further comprising:
    controlling density and size of the semiconductor nanowires by selecting a thickness of the metal interlayer.

18. The method of claim 15, further comprising:
    controlling a density of the semiconductor nanowires by controlling a growth temperature of the semiconductor nanowires.

19. The method of claim 15, wherein the metal interlayer comprises titanium, the entirely nitride layer comprises titanium nitride, and the semiconductor nanowires comprise a group Ill nitride.

20. The method of claim 15, wherein the metal interlayer is formed on the metal substrate by chemical vapor deposition (CVD), atomic layer deposition (ALD), a sputtering coating technique, pulsed laser deposition (PLD), thermal evaporation, or an e-beam evaporation.

* * * * *